United States Patent
Tokushima et al.

(10) Patent No.: US 12,516,276 B2
(45) Date of Patent: *Jan. 6, 2026

(54) SURFACE TREATMENT COMPOSITION

(71) Applicant: FUJIMI INCORPORATED, Aichi (JP)

(72) Inventors: Hideyuki Tokushima, Aichi (JP); Tsutomu Yoshino, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 399 days.

This patent is subject to a terminal disclaimer.

(21) Appl. No.: 18/125,632

(22) Filed: Mar. 23, 2023

(65) Prior Publication Data
US 2023/0313080 A1    Oct. 5, 2023

(30) Foreign Application Priority Data
Mar. 29, 2022  (JP) ................. 2022-053009

(51) Int. Cl.
| | | |
|---|---|---|
| *C11D 7/00* | (2006.01) | |
| *C11D 7/32* | (2006.01) | |
| *H01L 21/02* | (2006.01) | |
| *H01L 21/306* | (2006.01) | |

(52) U.S. Cl.
CPC .......... *C11D 7/3209* (2013.01); *C11D 7/3281* (2013.01); *H01L 21/02057* (2013.01); *H01L 21/30625* (2013.01); *C11D 2111/22* (2024.01)

(58) Field of Classification Search
CPC . C11D 7/3209; C11D 7/3281; C11D 2111/22; C11D 7/32; C11D 7/265; C11D 7/34; C11D 3/3769; C11D 3/2079; C11D 3/30; H01L 21/02057; H01L 21/30625; H01L 21/02065; H01L 21/02074; B08B 3/08; B24B 37/042; B24B 55/06; C09G 1/02; C09G 1/18; C09K 3/1463
USPC ....................................................... 510/175
See application file for complete search history.

(56) References Cited

U.S. PATENT DOCUMENTS

| | | |
|---|---|---|
| 2006/0019201 A1 | 1/2006 | Muramatsu et al. |
| 2007/0219104 A1 | 9/2007 | Grumbine et al. |
| 2018/0291309 A1 | 10/2018 | Frye et al. |

FOREIGN PATENT DOCUMENTS

| | | | | |
|---|---|---|---|---|
| JP | 2005347587 A | 12/2005 | | |
| JP | 2009530848 A | 8/2009 | | |
| JP | 2012533649 A | 12/2012 | | |
| JP | 2020090625 A | * 6/2020 | ............... | C11D 7/22 |
| JP | 2020516725 A | 6/2020 | | |
| WO | 2011008658 A1 | 1/2011 | | |

OTHER PUBLICATIONS

STIC Search Report dated Jun. 20, 2025.*
Office Action for JP Application No. 2022-053009, with a mailing date of Jun. 17, 2025.

* cited by examiner

*Primary Examiner* — Eisa B Elhilo
(74) *Attorney, Agent, or Firm* — Katten Muchin Rosenman LLP

(57) ABSTRACT

A means capable of sufficiently removing residues remaining on the surface of a polished object is to be provided. The present invention relates to a surface treatment composition, containing a component (A) and a component (B) and having pH of 8.0 or more:

component (A): a polymer having a constituent unit having a quaternary nitrogen-containing onium salt or a constituent unit of a structure (X) below,

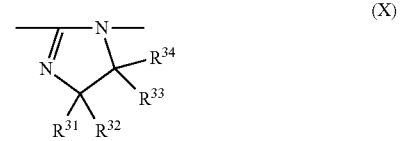

(X)

component (B): a buffer represented by a formula: $R-COO-NH_4^+$.

12 Claims, No Drawings

SURFACE TREATMENT COMPOSITION

CROSS-REFERENCE TO RELATED APPLICATION

The entire disclosure of Japanese Patent Application No. 2022-053009, filed on Mar. 29, 2022, is incorporated herein by reference in its entirety.

BACKGROUND

1. Technical Field

The present invention relates to a surface treatment composition, a surface treatment method, and a method for producing a semiconductor substrate.

2. Description of Related Arts

In recent years, a so-called chemical mechanical polishing (CMP) technique for physically polishing and flattening a semiconductor substrate in producing a device have been used in association with multilayer wiring on a surface of a semiconductor substrate. CMP is a method of flattening a surface of an object to be polished (polishing target) such as a semiconductor substrate, using a polishing composition (slurry) containing abrasive grains such as of silica, alumina, and ceria, an anticorrosive agent, a surfactant, and the like. The object to be polished (polishing target) is a wiring, a plug, and the like made of silicon, polysilicon, silicon oxide, silicon nitride, metal, and the like.

A large amount of impurities (also referred to as foreign substances or residues) remain on a surface of a semiconductor substrate after CMP procedure. The impurities include abrasive grains, a metal, an anticorrosive agent, and an organic substance such as a surfactant, which are derived from the polishing composition used in CMP; a silicon-containing material and a metal, which are generated by polishing a silicon-containing material, a metal wiring, a plug, or the like as an object to be polished; an organic substance such as pad debris generated from various pads; and the like.

Contamination of a surface of a semiconductor substrate with these impurities would adversely affect electrical characteristics of the semiconductor, and reduce reliability of the device. Therefore, it is desirable to introduce a cleaning step after the CMP step to remove these impurities from the surface of the semiconductor substrate.

As such a cleaning composition, for example, JP 2020-90625 A discloses a cleaning agent composition containing: a polymer (salt) (component A) having a specific constituent unit; and an amino group-containing compound (component B) other than the component A, the compound having at least one amino group and having 1 to 10 nitrogen atoms. JP 2020-90625 A discloses that the cleaning agent composition is excellent in cleaning properties and can improve smoothness of a surface of a substrate after cleaning.

SUMMARY

However, the technique of JP 2020-90625 A has a problem that foreign substances (residues) cannot be sufficiently removed in cleaning of a polished object.

Therefore, the present invention has been made in view of the above circumstances, and an object thereof is to provide a means capable of sufficiently removing residues remaining on a surface of a polished object.

The present inventors have intensively studied to solve the above problems. As a result, the present inventors have found that the above problems can be solved by an alkaline surface treatment composition containing a polymer having a constituent unit of a specific structure; and ammonium monocarboxylate acting as a buffer, and have completed the present invention.

That is, the above object can be achieved by a surface treatment composition containing a component (A) and a component (B) below, and having pH of 8.0 or more:
the component (A): a polymer having a constituent unit having a quaternary nitrogen-containing onium salt or a constituent unit of a structure (X) below:

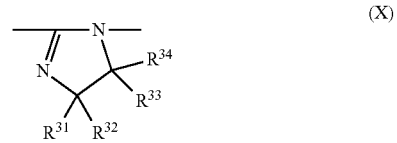

in the structure (X), $R^{31}$ to $R^{34}$ each independently represent a hydrogen atom, or a linear or branched alkyl group having from 1 to 10 carbon atoms,
the component (B): a buffer represented by a formula: $R-COO^-NH_4^+$ (wherein R is a linear or branched alkyl group having from 1 to 10 carbon atoms, or a phenyl group).

The present invention is to provides a surface treatment composition, which includes a component (A) and a component (B), in which a pH of the composition is 8.0 or more:
component (A): a polymer having a constituent unit having a quaternary nitrogen-containing onium salt or a constituent unit of a structure (X) below:

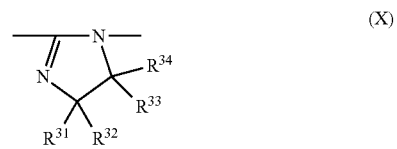

in the structure (X), $R^{31}$ to $R^{34}$ each independently represent a hydrogen atom, or a linear or branched alkyl group having from 1 to 10 carbon atoms,
component (B): a buffer represented by a formula: $R-COO^-NH_4^+$ (wherein R is a linear or branched alkyl group having from 1 to 10 carbon atoms, or a phenyl group). According to the present invention, a means capable of sufficiently removing residues remaining on a surface of a polished object can be provided. Specifically, according to the present invention, residues (for example, abrasive grain residues and organic residues) remaining on a surface of a polished object (particularly, a polished silicon nitride substrate) can be sufficiently removed. In addition, an etching rate for a polished object containing polycrystalline silicon can be suppressed to be low.

The present inventors presume a mechanism in which by such a configuration, residues on a surface of a polished object can be removed and an etching rate for A polished object containing polycrystalline silicon can be suppressed to be low, as follows.

That is, the surface treatment composition contains the specific components (A) and (B). Among them, the component (A) shows no pKa in water and is positively charged. Regardless of pH, zeta potentials of a polished object (particularly, a polished silicon nitride substrate), abrasive grain residues, organic residues (for example, pad debris and polymer), and the like are positively controlled, and thus adsorption of the residues to the polished object can be suppressed and prevented by electrostatic repulsion. In addition, the component (A) improves wettability of a surface of a polished object and makes it easy to form a water molecule film on the surface. Therefore, not only the adhesion of hydrophobic organic residues to a surface of a polished object can be suppressed, but also re-adhesion of organic residues can also be prevented. Therefore, with the surface treatment composition according to the present invention, residues can be efficiently removed. In addition, before a cleaning step (surface treatment, rinse polishing), a surface of a semiconductor substrate is usually polished with an alkaline slurry (polishing slurry) in a CMP step. A pH of a surface treatment composition in cleaning (rinse polishing) such a polished semiconductor substrate (polished object) with a surface treatment composition is increased due to the alkaline polishing slurry. As a result, a zeta potential of residue changes, thereby inducing adhesion of residues or increasing an etching rate for a polished object containing polycrystalline silicon. However, the presence of the component (B) can suppress increase in pH of a surface treatment composition in cleaning (rinse polishing). Therefore, zeta potentials of a polished object (particularly, a polished silicon nitride substrate), abrasive grain residues, organic residues (for example, pad debris and polymer), and the like can be controlled to the best state (positively controlled), and adsorption of the residues to the polished object can be suppressed and prevented by electrostatic repulsion therebetween. Therefore, with the surface treatment composition according to the present invention, residues can be efficiently removed. In addition, under alkaline condition, an etching rate for a polished object containing polycrystalline silicon greatly changes. However, due to the presence of the component (B), change in pH of the surface treatment composition in cleaning (rinse polishing) is small (it is hardly affected by an alkaline polishing slurry). For this reason, an etching rate for a polished object containing polycrystalline silicon can be suppressed to be low.

Note that the above mechanism is based on speculation, and the present invention should not be limited to the above mechanism at all.

Hereinafter, embodiments of the present invention will be described in detail, but the present invention is not limited only to the following embodiments. Various modifications can be made within the scope of the appended claims. Throughout the description, unless particularly stated otherwise, any expression in a singular form should be understood to encompass the concept of its plural form. Therefore, unless particularly stated otherwise, the article specifying a single form (for example, "a", "an", "the", and the like in the case of English language) should be understood to encompass the concept of its plural form. Further, unless particularly stated otherwise, any term used in the present description should be understood as a term that is used to have the meaning conventionally used in the relevant technical field. Therefore, unless defined otherwise, all the technical terms and scientific terms used in the present description have the same meaning as generally understood by a person ordinarily skilled in the art to which the present invention is pertained. If there is any conflict in meaning, the present description (including the definitions) takes priority. In the present description, unless otherwise noted, operations and measurements of physical properties and the like are performed under the conditions of room temperature (20° C. or higher and 25° C. or lower)/relative humidity of 40% RH or more and 50% RH or less.

Residue(s)

As used herein, the term "residue" represents a foreign substance(s) adhered to a surface of a polished object. Examples of the residue, although not particularly limited thereto, include residues derived from an object to be polished, organic residues described later, particle residues derived from abrasive grains (abrasive grain residues) contained in a polishing composition, residues including components other than the particle residues and the organic residues, other residues such as a mixture of the particle residues and the organic residues, and the like.

A total number of residues represents a total number of all residues regardless of the type of the residue. The total number of residues can be measured with a wafer defect inspection apparatus. The number of residues represents a total number of specific residues. A method for measuring the number of residues will be described in detail in Examples described later.

As used herein, the term "organic residue" represents a component including an organic substance such as an organic low molecular weight compound or polymer compound, an organic salt or the like, among foreign substances adhered to a surface of a polished object (object to be subjected to surface treatment).

Examples of the organic residue adhered to a polished object may include pad debris generated from a pad used in a polishing step or a rinse polishing step described later, components derived from an additive(s) contained in a polishing composition used in a polishing step or a surface treatment composition used in a rinse polishing step, and the like.

Since the organic residue and other foreign substances are greatly different in color and shape, it is possible to visually determine whether or not the foreign substance is an organic residue by scanning electron microscopy (SEM) observation. Further, it is also possible to determine whether or not the foreign substance is an organic residue by elemental analysis by energy dispersive X-ray spectroscopy (EDX) as necessary. The number of organic residues can be measured through a wafer defect inspection apparatus and SEM or EDX elemental analysis.

Polished Object

As used herein, the term "polished object" means a polished object after being polished in a polishing step. The polishing step is not particularly limited, but is preferably a CMP step.

A material contained in the object to be polished according to the present invention is not particularly limited. Examples thereof may include carbon-containing silicons such as silicon oxide, silicon nitride (SiN), and silicon carbonitride (SiCN), polycrystalline silicon (polysilicon), amorphous silicon, silicon materials doped with impurities, single metals, alloys, metal nitrides, compound semiconductors such as SiGe, and the like. Among these, at least one of silicon nitride, silicon oxide, or polysilicon is preferably contained. In a preferred embodiment, an object to be polished (for example, a semiconductor substrate before being polished) contains at least one selected from the group consisting of silicon nitride, silicon oxide, and polysilicon.

Examples of a film containing silicon oxide may include a TEOS (Tetraethyl Orthosilicate) type silicon oxide film (hereinafter, also simply referred to as "TEOS film") produced using tetraethyl orthosilicate as a precursor, a HDP (High Density Plasma) film, a USG (Undoped Silicate Glass) film, a PSG (Phosphorus Silicate Glass) film, a BPSG (Boron-Phospho Silicate Glass) film, an RTO (Rapid Thermal Oxidation) film, and the like. The materials contained in the object to be polished may be used singly or in a combination of two or more.

The polished object is preferably a polished semiconductor substrate, and more preferably a polished semiconductor substrate after being polished in a CMP step. This is because residues can cause breakdown of a semiconductor device, and thus in a case where the polished object is a polished semiconductor substrate, a cleaning step of the semiconductor substrate is required to be a step by which residues can be removed as much as possible.

In one embodiment of the present invention, the surface treatment composition can reduce residues on a surface even of a polished object containing both a hydrophilic material and a hydrophobic material. As used herein, the hydrophilic material refers to a material having a contact angle with water of less than 50°, and the hydrophobic material refers to a material having a contact angle with water of 50° or more. The contact angle with water is a value measured using a contact angle meter DropMaster (DMo-501) manufactured by Kyowa Interface Science Co., Ltd.

Specific examples of the hydrophilic material may include silicon oxide, silicon nitride, silicon oxynitride, tungsten, titanium nitride, tantalum nitride, boron-containing silicon, and the like. These hydrophilic materials may be used singly or two or more materials may be used in combination. According to a preferred embodiment of the present invention, the hydrophilic material is silicon oxide. According to a preferred embodiment of the present invention, the hydrophilic material is silicon nitride. Specific examples of the hydrophobic material may include polycrystalline silicon, monocrystalline silicon, amorphous silicon, carbon-containing silicon, and the like. These hydrophobic materials may be used singly or two or more materials may be used in combination. According to a preferred embodiment of the present invention, the hydrophobic material is polycrystalline silicon.

That is, according to a preferred embodiment of the present invention, the hydrophilic material is silicon oxide, and the hydrophobic material is polycrystalline silicon. According to a preferred embodiment of the present invention, the hydrophilic material is silicon nitride, and the hydrophobic material is polycrystalline silicon.

Surface Treatment Composition

The surface treatment composition according to the present invention contains a component (A) and a component (B) below, and the pH of the composition is 8.0 or more:
component (A): a polymer having a constituent unit having a quaternary nitrogen-containing onium salt or a constituent unit of the following structure (X):

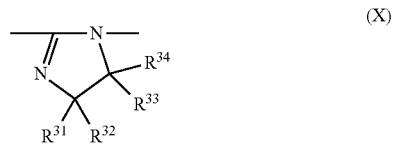

(X)

in the structure (X), $R^{31}$ to $R^{34}$ each independently represent a hydrogen atom, or a linear or branched alkyl group having from 1 to 10 carbon atoms,
component (B): a buffer represented by a formula: $R\text{—COO}^-\text{NH}_4^+$ (wherein R is a linear or branched alkyl group having from 1 to 10 carbon atoms, or a phenyl group).

The surface treatment composition according to the present invention can be used for reducing residues on a surface of a polished object. In addition, the surface treatment composition according to the present invention can be used for suppressing an etching rate of a polished object containing polycrystalline silicon at a low level.

In the present description, the polymer having a constituent unit having a quaternary nitrogen-containing onium salt or a constituent unit of the structure (X), as the component (A), is simply referred to as "polymer according to the present invention" or "polymer". In addition, the buffer represented by a formula: $R\text{—COO}^-\text{NH}_4^+$ (in the formula, R is a linear or branched alkyl group having from 1 to 10 carbon atoms, or a phenyl group), as the component (B), is simply referred to as "buffer according to the present invention" or "ammonium monocarboxylate according to the present invention" or "ammonium monocarboxylate".

Component (A)

The component (A) contains a polymer having at least one of a constituent unit having a quaternary nitrogen-containing onium salt or a constituent unit of the structure (X). That is, the polymer as the component (A) contains a constituent unit having a quaternary nitrogen-containing onium salt, contains a constituent unit of the structure (X), or contains both a constituent unit having a quaternary nitrogen-containing onium salt and a constituent unit of the structure (X). The polymer according to the present invention is cationic (a cationic polymer).

In the structure (X), $R^{31}$ to $R^{34}$ each independently represent a hydrogen atom, or a linear or branched alkyl group having from 1 to 10 carbon atoms. Here, $R^{31}$ to $R^{34}$ may be the same or different. The alkyl group is not particularly limited, and examples thereof may include a methyl group, an ethyl group, an n-propyl group, an isopropyl group, an n-butyl group, a sec-butyl group, a tert-butyl group, an isobutyl group, a 2-ethylbutyl group, a 3,3-dimethylbutyl group, an n-pentyl group, an i-pentyl group, a neopentyl group, a tert-pentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, an n-heptyl group, a 1-methylheptyl group, a 2,2-dimethylheptyl group, a 2-ethylheptyl group, a 2-butylheptyl group, an n-octyl group, a tert-octyl group, a 2-ethyloctyl group, a 2-butyloctyl group, a 3,7-dimethyloctyl group, an n-nonyl group, an n-decyl group, and the like. Among them, $R^{31}$ to $R^{34}$ are each independently preferably a hydrogen atom, or a linear or branched alkyl group having from 1 to 3 carbon atoms, more preferably a hydrogen atom, a methyl group, or an ethyl group, and still more preferably a hydrogen atom.

The polymer having a constituent unit of the structure (X) may be any polymer having the structure (X). The polymer may further have, in addition to the structure (X), a constituent unit (other constituent unit) having, for example, a methyleneamino group (—CH$_2$NH—), an ethyleneamino group (—CH$_2$CH$_2$NH—), a trimethyleneamino group (—CH$_2$CH$_2$CH$_2$NH—), a divalent group derived from amidine (—NH—C(=NH)—), a divalent group derived from guanidine (—NH—C(=NH)—NH—), or the like. The other constituent unit may be present singly or two or more other constituents may be present in combination.

The polymer having a constituent unit of the structure (X) may be produced by synthesis or may be a commercially available product. For example, the polymer having a constituent unit of the structure (X) can be obtained by condensation of dicyandiamide and diethylenetriamine. Alternatively, as a commercially available product, Unisense KHP10L (dicyandiamide-diethylenetriamine condensate), Unisense KHP10P (dicyandiamide-diethylenetriamine condensate) (both manufactured by Senka Corporation), and the like can be used.

The constituent unit having a quaternary nitrogen-containing onium salt, constituting the polymer as the component (A) is, for example, a constituent unit derived from a monomer having an ethylenically unsaturated group such as an acryloyl group (H$_2$C=CH—C(=O)—), a methacryloyl group (H$_2$C=C(CH$_3$)—C(=O)—), an acryloyloxy group (H$_2$C=CH—C(=O)—O—), a methacryloyloxy group (H$_2$C=C(CH$_3$)—C(=O)—O—), an acrylamide group (H$_2$C=CH—C(=O)—NH—), a methacrylamide group (H$_2$C=C(CH$_3$)—C(=O)—NH—), a vinyl group (H$_2$C=CH—), and an allyl group (H$_2$C=CHCH$_2$—); and a quaternary nitrogen-containing onium salt (—N$^+$(R)$_2$— or —N$^+$(R)$_3$).

Preferably, the constituent unit having a quaternary nitrogen-containing onium salt constituting the polymer as the component (A) has at least one of the following structure (Y) or the following structure (Z). The structure (Y) may be single or two or more structures (Y) may be in combination. When there are a plurality of structures (Y), the structures (Y) may exist in a block form or in a random form. When the polymer as the component (A) has two or more structures (Y), the structures (Y) may be the same or different. Similarly, the structure (Z) may be single or two or more structures (Z) may be in combination. When there are a plurality of structures (Z), the structures (Z) may exist in a block form or in a random form. When the polymer as the component (A) has two or more structures (Z), the structures (Z) may be the same or different. The polymer as the component (A) may have one or more structures (Y) and one or more structures (Z).

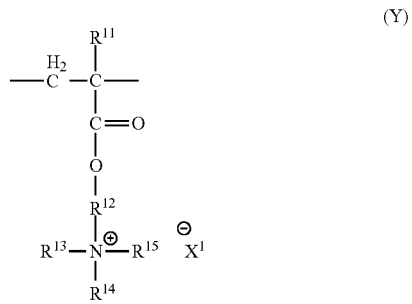

(Y)

In the structure (Y), $R^{11}$ represents a hydrogen atom or a methyl group. $R^{12}$ represents a linear or branched alkylene group having from 1 to 10 carbon atoms. $R^{12}$ is preferably a linear or branched alkylene group having from 2 to 6 carbon atoms, still more preferably an ethylene group (—CH$_2$CH$_2$—), a trimethylene group (—CH$_2$CH$_2$CH$_2$—) or a propylene group (—CH(CH$_3$)CH$_2$— or —CH$_2$CH(CH$_3$)—), and particularly preferably an ethylene group.

In the structure (Y), $R^{13}$ to $R^{15}$ each independently represent a linear or branched alkyl group having from 1 to 10 carbon atoms. Here, $R^{13}$ to $R^{15}$ may be the same or different. Examples of the alkyl group may include the same alkyl groups as described above in $R^{31}$ to $R^{34}$. Among them, $R^{13}$ to $R^{15}$ are preferably a linear or branched alkyl group having from 1 to 8 carbon atoms, more preferably a linear or branched alkyl group having from 1 to 3 carbon atoms, and still more preferably a methyl group or an ethyl group.

In the structure (Y), $X^1$ represents an anion moiety. The anion moiety (counter anion) is not particularly limited as long as it can form a salt with the quaternary nitrogen-containing onium salt (quaternary nitrogen-containing onium cation: —N$^+$(R$^{13}$)(R$^{14}$)(R$^{15}$)). Examples of such an anion may include halide ions such as a fluoride ion (F$^-$), a chloride ion (C$^-$), a bromide ion (Br$^-$), and an iodide ion (I$^-$); hydrogen sulfate ion (HSO$_4^-$); sulfite ion (HSO$_3^-$); an alkyl sulfate ion ((Alkyl)SO$_4^-$: "Alkyl" represents an alkyl group having from 1 to 8 carbon atoms, for example, a methyl group, an ethyl group, an n-propyl group, an isopropyl group, an n-butyl group, a sec-butyl group, a tert-butyl group, preferably a methyl group, an ethyl group) ; sulfate ion (SO$_4^{2-}$); nitrate ion (NO$_3^-$); dihydrogen phosphate ion (H$_2$PO$_4^-$), hydrogen phosphate ion (HPO$_4^{2-}$), phosphate ion (PO$_4^{3-}$); perchlorate ion (ClO$_4^-$); a hydroxide ion (OH$^-$); carboxylic acid-based anions such as citrate ion, acetate ion, malate ion, fumarate ion, lactate ion, glutarate ion, and maleate ion; and the like. Among them, $X^1$ (anion moiety, counter anion) is preferably a halide ion, an alkyl sulfate ion, or a nitrate ion, more preferably a halide ion or an alkyl sulfate ion, still more preferably a chloride ion, methyl sulfate ion (CH$_3$SO$_4^-$), or ethyl sulfate ion (C$_2$H$_5$SO$_4^-$), and particularly preferably a chloride ion.

In an embodiment of the present invention, the constituent unit having a quaternary nitrogen-containing onium salt has the structure (Y) wherein $R^{11}$ represents a hydrogen atom or a methyl group; $R^{12}$ represents a linear or branched alkylene group having from 2 to 6 carbon atoms; $R^{13}$ to $R^{15}$ each independently represent a linear or branched alkyl group having from 1 to 8 carbon atoms; and $X^1$ represents an anion moiety selected from a halide ion or an alkyl sulfate ion. In an embodiment of the present invention, the constituent unit having a quaternary nitrogen-containing onium salt has the structure (Y) wherein $R^{11}$ represents a hydrogen atom or a methyl group; $R^{12}$ represents an ethylene group, a trimethylene group, or a propylene group; $R^{13}$ to $R^{15}$ each independently represent a linear or branched alkyl group having from 1 to 3 carbon atoms; and $X^1$ represents a halide ion or an alkyl sulfate ion. In an embodiment of the present invention, the constituent unit having a quaternary nitrogen-containing onium salt has the structure (Y) wherein $R^{11}$ represents a hydrogen atom or a methyl group; $R^{12}$ represents an ethylene group; $R^{13}$ to $R^{15}$ each independently represent a methyl group or an ethyl group; and $X^1$ represents a chloride ion, methyl sulfate ion (CH$_3$SO$_4^-$), or ethyl sulfate ion (C$_2$H$_5$SO$_4^-$) (particularly, a chloride ion).

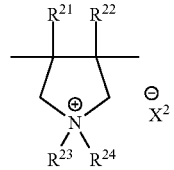

(Z)

In the structure (Z), $R^{21}$ and $R^{22}$ each independently represent a hydrogen atom, a linear or branched alkyl group having from 1 to 3 carbon atoms, or a phenyl group. Here, $R^{21}$ and $R^{22}$ may be the same or different. Examples of the alkyl group having from 1 to 3 carbon atoms may include a methyl group, an ethyl group, an n-propyl group, and an isopropyl group. Among them, $R^{21}$ and $R^{22}$ are preferably a hydrogen atom or an alkyl group having from 1 to 3 carbon atoms, more preferably a hydrogen atom, a methyl group, or an ethyl group, and still more preferably a hydrogen atom.

In the structure (Z), $R^{23}$ and $R^{24}$ each independently represent a linear or branched alkyl group having from 1 to 10 carbon atoms. Here, $R^{23}$ and $R^{24}$ may be the same or different. Examples of the alkyl group may include the same alkyl groups as described above in $R^{31}$ to $R^{34}$. Among them, $R^{23}$ and $R^{24}$ are preferably a linear or branched alkyl group having from 1 to 8 carbon atoms, more preferably a linear or branched alkyl group having from 1 to 3 carbon atoms, and still more preferably a methyl group.

In the structure (Z), $X^2$ represents an anion moiety. Here, as the anion moiety, anion moieties similar to those described in the anion moiety ($X^1$) in the structure (Y) may be exemplified. Among them, $X^2$ (anion moiety, counter anion) is preferably a halide ion, an alkyl sulfate ion, or nitrate ion, more preferably a halide ion or an alkyl sulfate ion, still more preferably a chloride ion, methyl sulfate ion ($CH_3SO_4^-$), or ethyl sulfate ion ($C_2H_5SO_4^-$), and particularly preferably a chloride ion.

In an embodiment of the present invention, the constituent unit having a quaternary nitrogen-containing onium salt has the structure (Z) wherein $R^{21}$ and $R^{22}$ each independently represent a hydrogen atom, or a linear or branched alkyl group having from 1 to 3 carbon atoms; $R^{23}$ and $R^{24}$ each independently represent a linear or branched alkyl group having from 1 to 8 carbon atoms; and $X^2$ represents an anion moiety selected among a halide ion and an alkyl sulfate ion. In an embodiment of the present invention, the constituent unit having a quaternary nitrogen-containing onium salt has the structure (Z) wherein $R^{21}$ and $R^{22}$ each independently represent a hydrogen atom, a methyl group, or an ethyl group; $R^{23}$ and $R^{24}$ each independently represent a linear or branched alkyl group having from 1 to 3 carbon atoms; and $X^2$ represents a halide ion (particularly, a chloride ion) or an alkyl sulfate ion (particularly, methyl sulfate ion or ethyl sulfate ion). In an embodiment of the present invention, the constituent unit having a quaternary nitrogen-containing onium salt has the structure (Z) wherein $R^{21}$ and $R^{22}$ represent a hydrogen atom; $R^{23}$ and $R^{24}$ represent a methyl group; and $X^2$ represents a chloride ion.

In a preferred embodiment of the present invention, the constituent unit having a quaternary nitrogen-containing onium salt has the following structure (Z') wherein $R^{21}$ and $R^{22}$ each independently represent a hydrogen atom, or a linear or branched alkyl group having from 1 to 3 carbon atoms; $R^{23}$ and $R^{24}$ each independently represent a linear or branched alkyl group having from 1 to 8 carbon atoms; $X^2$ represents an anion moiety selected among a halide ion and an alkyl sulfate ion; and n is an integer from 0 to 3. In a preferred embodiment of the present invention, the constituent unit having a quaternary nitrogen-containing onium salt has the following structure (Z') wherein $R^{21}$ and $R^{22}$ each independently represent a hydrogen atom, a methyl group, or an ethyl group; $R^{23}$ and $R^{24}$ each independently represent a linear or branched alkyl group having from 1 to 3 carbon atoms; $X^2$ represents a halide ion (particularly, a chloride ion) or an alkyl sulfate ion (particularly, methyl sulfate ion or ethyl sulfate ion); and n is 1 or 2. In a preferred embodiment of the present invention, the constituent unit having a quaternary nitrogen-containing onium salt has the following structure (Z') wherein $R^{21}$ and $R^{22}$ represent a hydrogen atom; $R^{23}$ and $R^{24}$ represent a methyl group; $X^2$ represents a chloride ion; and n is 1.

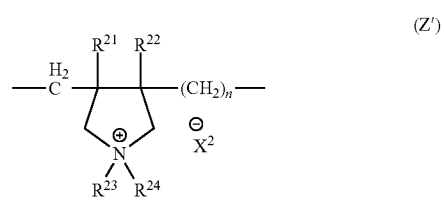

The component (A) preferably contains a polymer having a constituent unit having a quaternary nitrogen-containing onium salt. Here, the component (A) may contain a component other than a polymer having the specific constituent unit, but from the viewpoint of further improving the effect(s) according to the present invention, and the like, the component (A) is preferably composed of a polymer having the specific constituent unit (the component (A) is a polymer having the specific constituent unit). Due to the presence of the component (A), residues remaining on the surface of the polished object can be efficiently removed. That is, in a preferred embodiment of the present invention, the component (A) contains a polymer having a constituent unit having a quaternary nitrogen-containing onium salt. In a more preferred embodiment of the present invention, the component (A) is composed of a polymer having a constituent unit having a quaternary nitrogen-containing onium salt (the component (A) is a polymer having a constituent unit having a quaternary nitrogen-containing onium salt).

When the component (A) contains a polymer having a constituent unit having a quaternary nitrogen-containing onium salt, the polymer preferably has at least one of the structure (Y) or the structure (Z). The polymer having a constituent unit having a quaternary nitrogen-containing onium salt more preferably has one of the structure (Y) and the structure (Z) (the structure (Y) or (Z)).

When the component (A) contains a polymer having a constituent unit having a quaternary nitrogen-containing onium salt, the polymer may have a constituent unit having a quaternary nitrogen-containing onium salt other than the structure (Y) and the structure (Z). However, the constituent unit having a quaternary nitrogen-containing onium salt is preferably only the structure (Y) or the structure (Z), more preferably only the structure (Z), and particularly preferably only the structure (Z').

That is, in a preferred embodiment of the present invention, the constituent unit having a quaternary nitrogen-containing onium salt is only the following structure (Y) or only the following structure (Z):

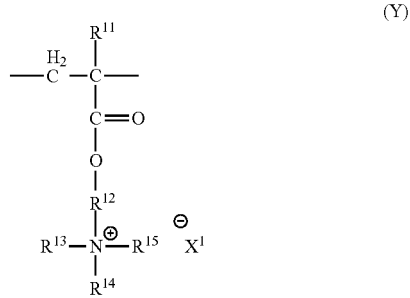
(Y)

In the structure (Y), $R^{11}$ represents a hydrogen atom or a methyl group, $R^{12}$ represents a linear or branched alkylene group having from 1 to 10 carbon atoms, $R^{13}$ to $R^{15}$ each independently represent a linear or branched alkyl group having from 1 to 10 carbon atoms, and $X^1$ represents an anion moiety.

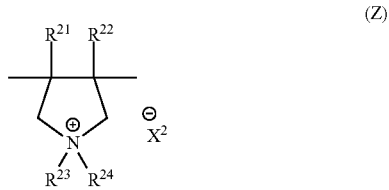
(Z)

In the structure (Z), $R^{21}$ and $R^{22}$ each independently represent a hydrogen atom, a linear or branched alkyl group having from 1 to 3 carbon atoms, or a phenyl group, $R^{23}$ and $R^{24}$ each independently represent a linear or branched alkyl group having from 1 to 10 carbon atoms, and $X^2$ represents an anion moiety.

In a more preferred embodiment of the present invention, the constituent unit having a quaternary nitrogen-containing onium salt is only the above structure (Z).

In a particularly preferred embodiment of the present invention, the constituent unit having a quaternary nitrogen-containing onium salt is only the following structure (Z').

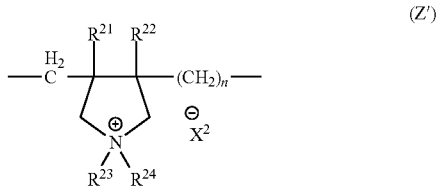
(Z')

In the structure (Z'), $R^{21}$ and $R^{22}$ each independently represent a hydrogen atom, a linear or branched alkyl group having from 1 to 3 carbon atoms, or a phenyl group, $R^{23}$ and $R^{24}$ each independently represent a linear or branched alkyl group having from 1 to 10 carbon atoms, $X^2$ represents an anion moiety, and n is an integer from 0 to 3.

The polymer having a constituent unit having a quaternary nitrogen-containing onium salt may be composed only of the structure (Y) or the structure (Z), or may have another constituent unit in addition to the structure (Y) or the structure (Z). The polymer having a constituent unit having a quaternary nitrogen-containing onium salt preferably has another constituent unit in addition to the structure (Y) or the structure (Z), and more preferably has another constituent unit in addition to the structure (Z).

When the polymer according to the present invention has another constituent unit, examples of the other constituent unit may include constituent units derived from monomers such as acrylic acid, methacrylic acid, dimethylaminoethyl acrylate, dimethylaminoethyl methacrylate, acrylamide, methacrylamide, acryloylmethyl diethyl betaine, methacryloylmethyl diethyl betaine, acryloyl ethyl dimethyl betaine, methacryloyl ethyl dimethyl betaine, methoxy polyethylene glycol acrylate, methoxy polyethylene glycol methacrylate, methoxy polypropylene glycol acrylate, methoxy polypropylene glycol methacrylate, 2-hydroxyethyl acrylate, 2-hydroxyethyl methacrylate, N-vinyl-2-pyrrolidone, and the like. The another constituent units may be contained singly, or may be contained in combination of two or more types thereof. Among them, the another constituent unit is preferably a constituent unit derived from a monomer selected from the group consisting of acrylic acid, methacrylic acid, acrylamide, methacrylamide, methacryloyl ethyl dimethyl betaine, methoxy polyethylene glycol methacrylate, 2-hydroxyethyl acrylate, 2-hydroxyethyl methacrylate, and N-vinyl-2-pyrrolidone, more preferably a constituent unit derived from a monomer selected from the group consisting of acrylic acid, methacrylic acid, acrylamide, and methacrylamide, and particularly preferably a constituent unit derived from a monomer selected from the group consisting of acrylic acid, and methacrylic acid.

When the polymer according to the present invention has another constituent unit, a composition (content) of the another constituent unit is, for example, 1 mol % or more, preferably 5 mol % or more, and more preferably 30 mol % or more, with respect to the total number of constituent units of the polymer. a composition (content) of the another constituent unit is, for example, 50 mol % or less, preferably 40 mol % or less, more preferably 30 mol % or less, with respect to the total number of constituent units of the polymer. When the polymer according to the present invention has another constituent unit, a composition (content) of the another constituent unit is, for example, 1 mol % or more and 50 mol % or less, preferably 5 mol % or more and 40 mol % or less, and more preferably 5 mol % or more and 30 mol % or less, with respect to the total number of constituent units of the polymer. Alternatively, when the polymer according to the present invention has another constituent unit, a composition (content) of the another constituent unit is, for example, 50 mol %, with respect to the total number of constituent units of the polymer.

The polymer having a constituent unit having a quaternary nitrogen-containing onium salt may be produced by synthesis or may be a commercially available product. Examples of the commercially available product may include Merquat (trade mark) 295 Polymer (dimethyldiallylammonium chloride/acrylic acid copolymer, Mw: 190,000), Merquat (trade mark) 550 Polymer (dimethyldiallylammonium chloride/acrylamide copolymer, Mw: 1,600,000), Merquat (trade mark) 100 Polymer (polydimethylmethylene piperidinium chloride) (all of them are manufactured by The Lubrizol Corporation); Unisense FPA-100L (polydimethyldiallylammonium chloride (polydimethylmethylene piperidinium chloride), Mw: less than 20,000), Unisense FPA-101L (polydimethyldiallylammonium chloride (polydimethylmethylene piperidinium chloride)), Unisense FPA-102L (polydimethyldiallylammonium chloride (polydimethylmethylene piperidinium chloride), Mw: 20,000 to 100,000), Unisense FPA-1000L (polydimethyldiallylammonium chloride (polydimethylmethylene piperidinium chloride), Mw: 100,000 to 500,000), Unisense FPA-1001L (polydimethyldiallylammonium chloride (polydimethylmethylene piperidinium chloride)), Unisense FPA-1002L (polydimethyldiallylammonium chloride (polydimethylmethylene piperidinium chloride)) (all of them are manufactured by Senka Corporation); Plascize L-440 (methacryloyl ethyl dimethyl betaine/methacryloyl ethyl trimethylammonium chloride/methoxy polyethylene glycol methacrylate copolymer), Plascize L-440W (methacryloyl ethyl dimethyl betaine/methacryloyl ethyl trimethylammonium chloride/methoxy polyethylene glycol methacrylate copolymer), Plascize L-450 (methacryloyl ethyl dimethyl betaine/methacryloyl ethyl trimethylammonium chloride/2-hydroxyethyl methacrylate copolymer), Plascize L-450W (methacryloyl ethyl dimethyl betaine/methacryloyl ethyl trimethylammonium chloride/2-hydroxyethyl methacrylate copolymer) (all of them are manufactured by Goo Chemical Co., Ltd.); H.C. Polymer 1S(M) (vinylpyrrolidone/N,N-dimethylaminoethyl methacrylic acid copolymer diethyl sulfate, Mw: 500,000), H.C. Polymer 5W (vinylpyrrolidone/N,N-dimethylaminoethyl methacrylic acid copolymer diethyl sulfate, Mw: 150,000) (all of them are manufactured by Osaka Organic Chemical Industry Ltd.); and the like.

As used herein, the term "polymer" is referred to a polymer having a weight average molecular weight (Mw) of 1,000 or more. The weight average molecular weight (Mw) of the component (A) is, for example, 5,000 or more, preferably 10,000 or more, more preferably 20,000 or more, and particularly preferably more than 100,000. The weight average molecular weight (Mw) of the component (A) is, for example, 5,000,000 or less, preferably 3,000,000 or less, more preferably 2,000,000 or less, particularly preferably 1,000,000 or less, particularly more preferably 500,000 or less, and most preferably 250,000 or less. That is, in an embodiment of the present invention, the weight average molecular weight (Mw) of the component (A) is 5,000 or more and 5,000,000 or less. In an embodiment of the present invention, the weight average molecular weight (Mw) of the component (A) is 10,000 or more and 3,000,000 or less. In an embodiment of the present invention, the weight average molecular weight (Mw) of the component (A) is 20,000 or more and 1,000,000 or less. In an embodiment of the present invention, the weight average molecular weight (Mw) of the component (A) is more than 100,000 and 500,000 or less. In an embodiment of the present invention, the weight average molecular weight (Mw) of the component (A) is more than 100,000 and 250,000 or less. In the present description, the weight average molecular weight (Mw) of the component (A) is measured according to the method described in the following Examples.

The component (A) can be used singly or two or more types thereof can be used in combination.

A content of the component (A) in the surface treatment composition is appropriately set according to the type of the component (A) to be used and the desired effect(s). The content of the component (A) is preferably 0.01 mass % or more, more preferably 0.05 mass % or more, and still more preferably more than 0.05 mass %, with respect to 100 mass % of the total mass of the surface treatment composition (with respect to the surface treatment composition). The upper limit of the content of the component (A) in the surface treatment composition is preferably 1 mass % or less, more preferably 0.5 mass % or less, and still more preferably 0.3 mass % or less, with respect to 100 mass % of the total mass of the surface treatment composition (with respect to the surface treatment composition). In an embodiment of the present invention, the content of the component (A) is 0.01 mass % or more and 1 mass % or less with respect to 100 mass % of the total mass of the surface treatment composition (with respect to the surface treatment composition). In an embodiment of the present invention, the content of the component (A) is 0.05 mass % or more and 0.5 mass % or less with respect to 100 mass % of the total mass of the surface treatment composition (with respect to the surface treatment composition). In an embodiment of the present invention, the content of the component (A) is more than 0.05 mass % and 0.3 mass % or less with respect to 100 mass % of the total mass of the surface treatment composition (with respect to the surface treatment composition). When the surface treatment composition contains two or more components (A), the content of the component (A) is intended to be the total amount thereof.

Component (B)

The surface treatment composition according to the present invention contains the component (B) in addition to the component (A). The component (B) contains a buffer (ammonium monocarboxylate) represented by a formula: $R—COO^-NH_4^+$. As used herein, the term "buffer" is referred to as a substance that imparts a buffering action to the surface treatment composition (solution) in order to keep the pH constant.

The component (B) may contain a component (for example, a known buffer) other than the buffer represented by the formula: $R—COO^-NH_4^+$. From the viewpoint of further improving the effect(s) by the present invention, and the like, the component (B) is preferably composed of a buffer represented by the formula: $R—COO^-NH_4^+$ (the component (B) is a buffer represented by the formula: $R—COO^-NH_4^+$). Due to the presence of the component (B), residues remaining on a surface of a polished object can be efficiently removed. In addition, an etching rate for a polished object containing polycrystalline silicon can be suppressed at a low level. That is, in a preferred embodiment of the present invention, the component (B) is composed of a buffer represented by the formula: $R—COO^-NH_4^+$ (the component (B) is a buffer represented by the formula: $R—COO^-NH_4^+$).

In the formula: $R—COO^-NH_4^+$, R is a linear or branched alkyl group having from 1 to 10 carbon atoms, or a phenyl group. Here, examples of the alkyl group may include the same alkyl groups as described above in $R^{31}$ to $R^{34}$. Among them, R is preferably a linear or branched alkyl group having from 1 to 8 carbon atoms, more preferably a linear or branched alkyl group having from 1 to 3 carbon atoms, still more preferably a methyl group (ammonium acetate) or an ethyl group (ammonium propionate), and particularly preferably a methyl group (ammonium acetate), from the viewpoint of further improving the effect(s) by the present invention, and the like. That is, in a preferred embodiment of the present invention, the buffer is represented by the formula: $R—COO^-NH_4^+$, wherein R is a linear or branched alkyl group having from 1 to 8 carbon atoms. In a more preferred embodiment of the present invention, the buffer is represented by the formula: $R—COO^-NH_4^+$, wherein R is a linear or branched alkyl group having from 1 to 3 carbon atoms. In a further preferred embodiment of the present invention, the buffer is represented by the formula: $R—COO^-NH_4^+$, wherein R is a methyl group or an ethyl group (the buffer is ammonium acetate or ammonium propionate). In a particularly preferred embodiment of the present invention, the buffer is ammonium acetate.

A content of the component (B) in the surface treatment composition is appropriately set according to the type of the component (B) to be used and the desired effect(s). The content of the component (B) is preferably 0.05 mass % or more, more preferably more than 0.1 mass %, and still more preferably 0.2 mass % or more, with respect to 100 mass % of the total mass of the surface treatment composition (with respect to the surface treatment composition). The upper limit of the content of the component (B) in the surface treatment composition is preferably 2 mass % or less, more preferably 1.5 mass % or less, and still more preferably 1.0 mass % or less, with respect to 100 mass % of the total mass of the surface treatment composition (with respect to the surface treatment composition). In an embodiment of the present invention, the content of the component (B) is 0.05 mass % or more and 2 mass % or less with respect to 100 mass % of the total mass of the surface treatment composition (with respect to the surface treatment composition). In an embodiment of the present invention, the content of the component (B) is more than 0.1 mass % and 1.5 mass % or less with respect to 100 mass % of the total mass of the surface treatment composition (with respect to the surface treatment composition). In an embodiment of the present invention, the content of the component (B) is 0.2 mass % or more and 1.0 mass % or less with respect to 100 mass % of the total mass of the surface treatment composition (with respect to the surface treatment composition). When the surface treatment composition contains two or more components (B), the content of the component (B) intended to be the total amount thereof.

In place of or in addition to the above, a mixing ratio between the component (A) and the component (B) in the surface treatment composition is appropriately set according to the type of the component (A) and the component (B) to be used and the desired effect(s). The mixing ratio of the component (A) to the component (B) (content ratio of component (A)/component (B)) (mass ratio) is preferably 0.1 or more, more preferably 0.2 or more, and still more preferably more than 0.3. The mixing ratio of the component (A) to the component (B) (content ratio of component (A)/component (B)) (mass ratio) is preferably 1.5 or less, more preferably 1.0 or less, and still more preferably less than 1.0. In an embodiment of the present invention, the mixing ratio of the component (A) to the component (B) (content ratio of component (A)/component (B)) (mass ratio) is 0.1 or more and 1.5 or less. In an embodiment of the present invention, the mixing ratio of the component (A) to the component (B) (content ratio of component (A)/component (B)) (mass ratio) is 0.2 or more and 1.0 or less. In an embodiment of the present invention, the mixing ratio of the component (A) to the component (B) (content ratio of component (A)/component (B)) (mass ratio) is more than 0.3 and less than 1.0.

pH Adjusting Agent

The surface treatment composition according to the present invention essentially contains the components (A) and (B), and preferably further contains a pH adjusting agent in addition to these components. That is, in a preferred embodiment of the present invention, the surface treatment composition further contains a component (C):
component (C): a pH adjusting agent.

The pH adjusting agent is not particularly limited, and a known pH adjusting agent used in the field of the surface treatment composition can be used, and a known acid, base, a salt thereof, or the like can be used. Examples of the pH adjusting agent may include organic acids such as carboxylic acids including formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acid, and anthranilic acid, sulfonic acid, and organic phosphonic acid; inorganic acids such as nitric acid, carbonic acid, hydrochloric acid, phosphoric acid, hypophosphorous acid, phosphorous acid, phosphonic acid, boric acid, hydrofluoric acid, orthophosphoric acid, pyrophosphoric acid, polyphosphoric acid, metaphosphoric acid, and hexametaphosphoric acid; hydroxides of alkali metals, such as potassium hydroxide (KOH) and sodium hydroxide (NaOH); carbonates of alkali metals, such as potassium carbonate ($K_2CO_3$) and sodium carbonate ($N_2CO_3$); hydroxide of Group 2 elements; ammonia (ammonium hydroxide); organic bases such as quaternary ammonium hydroxide compounds; and the like. As the pH adjusting agent, synthesized products or commercially available products may be used. These pH adjusting agents can be used singly or two or more types thereof can be used in combination. Among them, potassium hydroxide, sodium hydroxide, ammonia, and sodium carbonate are preferable, potassium hydroxide, sodium hydroxide, and ammonia are more preferable, and ammonia is particularly preferable. That is, in a preferred embodiment of the present invention, the pH adjusting agent is at least one selected from the group consisting of potassium hydroxide, sodium hydroxide, ammonia, and sodium carbonate. In a more preferred embodiment of the present invention, the pH adjusting agent is at least one selected from the group consisting of potassium hydroxide, sodium hydroxide, and ammonia. In a particularly preferred embodiment of the present invention, the pH adjusting agent is ammonia.

A content of the pH adjusting agent in the surface treatment composition may be appropriately selected so as to attain a desired pH value of the surface treatment composition described in detail below.

pH of Surface Treatment Composition

A pH of the surface treatment composition according to the present invention is 8.0 or more. When the pH of the surface treatment composition is less than 8.0, residues remaining on a surface of a polished object cannot be sufficiently removed. From the viewpoint of further improving the effect(s) according to the present invention, and the like, the pH of the surface treatment composition is preferably more than 8.0, and more preferably 8.5 or more. The pH of the surface treatment composition is preferably less than 11.0, and more preferably less than 10.0. That is, in an embodiment of the present invention, the pH of the surface treatment composition is more than 8.0 and less than 11.0. In an embodiment of the present invention, the pH of the surface treatment composition is 8.5 or more and less than 10.0. As the pH of the surface treatment composition, a value measured by the method described in Examples is adopted.

Solvent

The surface treatment composition according to the present invention preferably contains a solvent. The solvent serves to disperse or dissolve each component. The solvent preferably contains water, and is more preferably only water. The solvent may also be a mixed solvent of water and an organic solvent for dispersing or dissolving each component. In this case, examples of the organic solvent to be used may include acetone, acetonitrile, ethanol, methanol, isopropanol, glycerin, ethylene glycol, propylene glycol, triethanolamine, and the like, which are an organic solvent miscible with water. Alternatively, respective components may be dispersed or dissolved by using an organic solvent without being mixed with water, and then mixed with water. These organic solvents can be used singly or two or more types thereof can be used in combination.

From the viewpoint of preventing contamination on a polished object and inhibition of action(s) of other component(s), water that does not contain residues as much as possible is preferred. For example, water, in which a total content of transition metal ions is 100 ppb or less, is preferable. Here, purity of water can be increased by, for example, operations such as removal of a residual ion(s) with an ion exchange resin, removal of foreign substance(s) with a filter, and distillation. Specifically, for example, use of deionized water (ion-exchanged water), pure water, ultrapure water, distilled water, and the like is preferable.

Surfactant

The surface treatment composition according to the present invention may further contain a surfactant. The type of the surfactant is not particularly limited, and the surfactant may be any of nonionic, anionic, cationic, and amphoteric surfactants.

Examples of the nonionic surfactant may include alkyl ether type surfactants such as polyoxyethylene lauryl ether and polyoxyethylene oleyl ether; alkylphenyl ether type surfactants such as polyoxyethylene octylphenyl ether; alkyl ester type surfactants such as polyoxyethylene laurate; alkylamine type surfactants such as polyoxyethylene laurylamino ether; alkylamide type surfactants such as polyoxyethylene lauric acid amide; polypropylene glycol ether type surfactants such as polyoxyethylene polyoxypropylene ether; alkanolamide type surfactants such as oleic acid diethanolamide; allyl phenyl ether type surfactants such as polyoxyalkylene allyl phenyl ether; and the like. In addition, propylene glycol, diethylene glycol, monoethanolamine, alcohol ethoxylate, alkylphenol ethoxylate, tertiary acetylene glycol, alkanolamide, and the like can also be used as the nonionic surfactant.

Examples of the anionic surfactant may include carboxylic acid type surfactants such as sodium myristate, sodium palmitate, sodium stearate, sodium laurate, and potassium laurate; sulfuric acid ester type surfactants such as sodium octyl sulfate; phosphoric acid ester type surfactants such as lauryl phosphate and sodium lauryl phosphate; sulfonic acid type surfactants such as sodium dioctyl sulfosuccinate and sodium dodecylbenzenesulfonate; and the like.

Examples of the cationic surfactant may include compounds other than the component (A), and examples thereof may include amines such as laurylamine hydrochloride; quaternary ammonium salts such as polyethoxyamine and lauryltrimethylammonium chloride; pyridium salts such as lauryl pyridinium chloride; and the like. Since the component (A) can serve as a cationic surfactant, a cationic surfactant is not necessarily separately added beside the component (A).

Examples of the amphoteric surfactant may include lecithin, alkylamine oxides, alkyl betaines such as N-alkyl-N, N-dimethylammonium betaine, sulfobetaine, and the like.

The surfactant can be used singly or two or more types thereof can be used in combination. As the surfactant, commercially available products or synthesized products may be used.

When the surface treatment composition contains a surfactant, a lower limit of a content of the surfactant is preferably 0.01 mass % or more, and more preferably 0.05 mass % or more, with respect to 100 mass % of the total mass of the surface treatment composition.

An upper limit of a content of the surfactant in the surface treatment composition is preferably 5 mass % or less, and more preferably 1 mass % or less, with respect to 100 mass % of the total mass of the surface treatment composition. When the surface treatment composition contains two or more types of surfactants, the content of the surfactant is intended to be a total amount thereof.

Chelating Agent

The surface treatment composition according to the present invention may further contain a chelating agent. Examples of the chelating agent may include aminocarboxylic acid-based chelating agents and organic phosphonic acid-based chelating agents. Examples of the aminocarboxylic acid-based chelating agent may include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetramine hexaacetic acid, and sodium triethylenetetramine hexaacetate. Examples of the organic phosphonic acid-based chelating agent may include 2-aminoethylphosphonic acid, 1-hydroxyethylidene-1,1-diphosphonic acid, aminotri(methylenephosphonic acid), ethylenediaminetetrakis(methylenephosphonic acid) (EDTPO), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxy phosphonic acid, 2-phosphonobutane-1,2-dicarboxylic acid, 1-phosphonobutane-2,3,4-tricarboxylic acid, and a-methylphosphonosuccinic acid. Among them, the organic phosphonic acid-based chelating agent is more preferable. Among them, ethylenediaminetetrakis(methylenephosphonic acid), diethylenetriaminepenta(methylenephosphonic acid), and diethylenetriaminepentaacetic acid are exemplified as a preferable chelating agent. As a particularly preferable cheating agent, ethylenediaminetetrakis(methylenephosphonic acid) and diethylenetriaminepenta(methylenephosphonic acid) are exemplified.

The chelating agent can be used singly or two or more types thereof can be used in combination. As the chelating agent, commercially available products or synthesized products may be used.

When the surface treatment composition contains a chelating agent, a lower limit of a content of the chelating agent is preferably 0.0001 mass % or more, more preferably 0.001 mass % or more, and still more preferably 0.002 mass % or more, with respect to 100 mass % of the total mass of the surface treatment composition. An upper limit of a content of the chelating agent is preferably 1 mass % or less, more preferably 0.5 mass % or less, still more preferably 0.3 mass % or less, and particularly preferably 0.15 mass % or less. When the surface treatment composition contains two or more types of chelating agents, the content of the chelating agent is intended to be a total amount thereof.

Other Additives

The surface treatment composition according to an embodiment of the present invention may contain other additive(s) at any proportion as necessary as long as the effect(s) by the present invention is not impaired. However, it is desirable that components other than the essential components of the surface treatment composition according to an embodiment of the present invention are not added as much as possible because such components may cause foreign substances (residues). Therefore, an amount thereof is preferably as small as possible. Examples of the other additive may include antifungal agents (antiseptic agents), dissolved gases, reducing agents, oxidizing agents, and the like. The surface treatment composition according to the present invention is alkaline. The surface treatment composition according to the present invention contains the polymer (the component (A)). Therefore, among these additives, the surface treatment composition according to the present invention preferably contains an antifungal agent (antiseptic agent). When the surface treatment composition according to the present invention contains an antifungal agent (antiseptic agent), the antifungal agent (antiseptic agent) that can be used is not particularly limited, and can be appropriately selected according to the type of the polymer (component (A)). Specific examples of the antifungal agent (antiseptic agent) may include isothiazoline-based antifungal agents such as 2-methyl-4-isothiazolin-3-one, 5-chloro-2-methyl-4-isothiazolin-3-one, and 1,2-benzisothiazol-3(2H)-one (BIT), phenoxyethanol, and the like.

Alternatively, the antifungal agent (antiseptic agent) may be a compound represented by the following Chemical Formula 1.

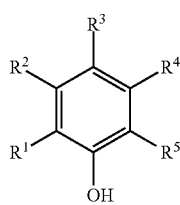

(Chemical Formula 1)

In Chemical Formula 1, $R^1$ to $R^5$ are each independently a hydrogen atom, or a substituent including at least two atoms selected from the group consisting of a carbon atom, a hydrogen atom, and an oxygen atom.

Examples of the substituent including at least two atoms selected from the group consisting of a carbon atom, a hydrogen atom, and an oxygen atom may include a hydroxy group, a carboxy group, an alkyl group having from 1 to 20 carbon atoms, a hydroxyalkyl group having from 1 to 20 carbon atoms, an alkoxy group having from 1 to 20 carbon atoms, a hydroxyalkoxy group having from 1 to 20 carbon atoms, an alkoxycarbonyl group having from 2 to 21 carbon atoms, an aryl group having from 6 to 30 carbon atoms, an aralkyl group (arylalkyl group) having from 7 to 31 carbon atoms, an aryloxy group having from 6 to 30 carbon atoms, an aryloxycarbonyl group having from 6 to 30 carbon atoms, an aralkyloxycarbonyl group having from 8 to 32 carbon atoms, an acyl group having from 2 to 20 carbon atoms, an acyloxy group having from 2 to 20 carbon atoms, and the like.

More specifically, examples of the alkyl group having from 1 to 20 carbon atoms may include linear alkyl groups such as a methyl group, an ethyl group, an n-propyl group, an n-butyl group, an n-pentyl group, an n-hexyl group, an n-heptyl group, an n-octyl group, an n-nonyl group, and an n-decyl group; branched alkyl groups such as an isopropyl group, an isobutyl group, an s-butyl group, a t-butyl group, a t-amyl group, a neopentyl group, a 3-methylpentyl group, a 1,1-diethylpropyl group, a 1,1-dimethylbutyl group, a 1-methyl-1-propylbutyl group, a 1,1-dipropylbutyl group, a 1,1-dimethyl-2-methylpropyl group, and a 1-methyl-1-isopropyl-2-methylpropyl group; cyclic alkyl groups such as a cyclobutyl group, a cyclopentyl group, a cyclohexyl group, a cycloheptyl group, a cyclooctyl group, and a norbornenyl group; and the like.

Examples of the hydroxyalkyl group having from 1 to 20 carbon atoms may include a hydroxymethyl group, a 2-hydroxyethyl group, a 2-hydroxy-n-propyl group, a 3-hydroxy-n-propyl group, a 2-hydroxy-n-butyl group, a 3-hydroxy-n-butyl group, a 4-hydroxy-n-butyl group, a 2-hydroxy-n-pentyl group, a 3-hydroxy-n-pentyl group, a 4-hydroxy-n-pentyl group, a 5-hydroxy-n-pentyl group, a 2-hydroxy-n-hexyl group, a 3-hydroxy-n-hexyl group, a 4-hydroxy-n-hexyl group, a 5-hydroxy-n-hexyl group, a 6-hydroxy-n-hexyl group, and the like.

Examples of the alkoxy group having from 1 to 20 carbon atoms may include linear alkoxy groups such as a methoxy group, an ethoxy group, an n-propyloxy group, an n-butyloxy group, an n-pentyloxy group, an n-hexyloxy group, an n-heptyloxy group, an n-octyloxy group, an n-nonyloxy group, and an n-decyloxy group; branched alkoxy groups such as an isopropyloxy group, an isobutyloxy group, an s-butyloxy group, a t-butyloxy group, a t-amyloxy group, a neopentyloxy group, a 3-methylpentyloxy group, a 1,1-diethylpropyloxy group, a 1,1-dimethylbutyloxy group, a 1-methyl-1-propylbutyloxy group, a 1,1 dipropylbutyloxy group, a 1,1-dimethyl-2-methylpropyloxy group, and a 1-methyl-1-isopropyl-2-methylpropyloxy group; cyclic alkoxy groups such as a cyclobutyloxy group, a cyclopentyloxy group, a cyclohexyloxy group, a cycloheptyloxy group, a cyclooctyloxy group, and a norbornenyloxy group; and the like.

Examples of the hydroxyalkoxy group having from 1 to 20 carbon atoms may include a hydroxymethoxy group, a 2-hydroxyethoxy group, a 2-hydroxy-n-propyloxy group, a 3-hydroxy-n-propyloxy group, a 2-hydroxy-n-butyloxy group, a 3-hydroxy-n-butyloxy group, a 4-hydroxy-n-butyloxy group, a 2-hydroxy-n-pentyloxy group, a 3-hydroxy-n-pentyloxy group, a 4-hydroxy-n-pentyloxy group, a 5-hydroxy-n-pentyloxy group, a 2-hydroxy-n-hexyloxy group, a 3-hydroxy-n-hexyloxy group, a 4-hydroxy-n-hexyloxy group, a 5-hydroxy-n-hexyloxy group, a 6-hydroxy-n-hexyloxy group, and the like.

Examples of the alkoxycarbonyl group having from 2 to 21 carbon atoms may include a methoxycarbonyl group, an ethoxycarbonyl group, a propoxycarbonyl group, a butoxycarbonyl group, a pentyloxycarbonyl group, a hexyloxycarbonyl group, an octyloxycarbonyl group, a decyloxycarbonyl group, and the like.

Examples of the aryl group having from 6 to 30 carbon atoms may include a phenyl group, a naphthyl group, an anthranil group, a pyrenyl group, and the like.

Examples of the aralkyl group (arylalkyl group) having from 7 to 31 carbon atoms may include a benzyl group, a phenethyl group (phenyl ethyl group), and the like. Examples of the aryloxy group having from 6 to 30 carbon atoms may include a phenyloxy group (phenoxy group), a naphthyloxy group, an anthraniloxy group, a pyrenyloxy group, and the like.

Examples of the aryloxycarbonyl group having from 7 to 31 carbon atoms may include a phenyloxycarbonyl group, a naphthyloxycarbonyl group, an anthranyloxycarbonyl group, a pyrenyloxycarbonyl group, and the like.

Examples of the aralkyloxycarbonyl group having from 8 to 32 carbon atoms may include a benzyloxycarbonyl group, a phenethyloxycarbonyl group, and the like.

Examples of the acyl group having from 1 to 20 carbon atoms may include a methanoyl group (formyl group), an ethanoyl group (acetyl group), a propanoyl group, a butanoyl group, a pentanoyl group, a hexanoyl group, an octanoyl group, a decanoyl group, a benzoyl group, and the like.

Examples of the acyloxy group having from 1 to 20 carbon atoms may include a formyloxy group, an acetyloxy group, a propanoyloxy group, a butanoyloxy group, a pentanoyloxy group, a hexanoyloxy group, an octanoyloxy group, a decanoyloxy group, a benzoyloxy group, and the like.

Further, the antifungal agent represented by the Chemical Formula 1 is preferably at least one selected from the group consisting of compounds represented by Chemical Formulae 1-a to 1-c.

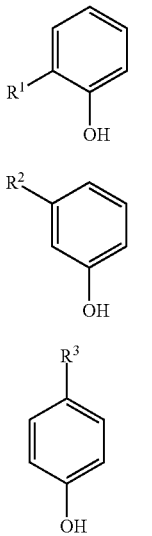

(Chemical Formula 1-a)

(Chemical Formula 1-b)

(Chemical Formula 1-c)

In Chemical Formulae 1a to 1c, $R^1$ to $R^3$ are each independently a substituent including at least two atoms selected from the group consisting of a carbon atom, a hydrogen atom, and an oxygen atom.

Examples of the substituent including at least two atoms selected from the group consisting of a carbon atom, a hydrogen atom, and an oxygen atom are the same as those described above, and thus the description thereof is omitted here.

More specific examples of the compound represented by the Chemical Formula 1 may include para-oxybenzoic acid esters (para-hydroxybenzoic acid esters) such as methyl para-oxybenzoate (methyl para-hydroxybenzoate), ethyl para-oxybenzoate (ethyl para-hydroxybenzoate), butyl para-oxybenzoate (butyl para-hydroxybenzoate), and benzyl para-oxybenzoate (benzyl para-hydroxybenzoate); salicylic acid, methyl salicylate, phenol, catechol, resorcinol, hydroquinone, isopropylphenol, cresol, thymol, phenoxyethanol, phenylphenols (2-phenylphenol, 3-phenylphenol, and 4-phenylphenol), 2-phenylethyl alcohol (phenethyl alcohol), and the like.

Among them, from the viewpoint of more effectively exhibiting expected effect(s) by the present invention, the compound represented by the Chemical Formula 1 is preferably at least one selected from the group consisting of ethyl para-oxybenzoate, butyl para-oxybenzoate, and phenylphenol, and more preferably butyl para-oxybenzoate.

Alternatively, the antifungal agent (antiseptic agent) can be an unsaturated fatty acid. Examples of the unsaturated fatty acid may include monounsaturated fatty acids such as crotonic acid, myristoleic acid, palmitoleic acid, oleic acid, and ricinoleic acid; diunsaturated fatty acids such as sorbic acid, linoleic acid, and eicosadienoic acid; triunsaturated fatty acids such as linolenic acid, pinolenic acid, and eleostearic acid; tetraunsaturated fatty acids such as stearidonic acid and arachidonic acid; pentaunsaturated fatty acids such as bosseopentaenoic acid and eicosapentaenoic acid; hexaunsaturated fatty acids such as docosahexaenoic acid and nisinic acid; and the like.

Among them, the unsaturated fatty acid is preferably sorbic acid, from the viewpoint of more effectively exhibiting expected effect(s) by the present invention.

In addition to the above, 1,2-alkanediols such as 1,2-pentanediol, 1,2-hexanediol, and 1,2-octanediol; alkyl glyceryl ethers such as 2-ethylhexyl glyceryl ether (ethylhexylglycerin); and compounds such as capric acid, dehydroacetic acid, and the like may be used as the antifungal agent (antiseptic agent).

The antifungal agent (antiseptic agent) may be used singly or two or more types thereof may be used in combination.

When the surface treatment composition contains an antifungal agent (antiseptic agent), a lower limit of a content (concentration) of the antifungal agent (antiseptic agent) is not particularly limited, but is preferably 0.0001 mass % or more, more preferably 0.001 mass % or more, still more preferably 0.005 mass % or more, and particularly preferably 0.01 mass % or more, with respect to 100 mass % of the total mass of the surface treatment composition (with respect to the surface treatment composition). An upper limit of a content (concentration) of the antifungal agent (antiseptic agent) is not particularly limited, but is preferably 5 mass % or less, more preferably 1 mass % or less, still more preferably 0.5 mass % or less, and particularly preferably 0.1 mass % or less, with respect to 100 mass % of the total mass of the surface treatment composition (with respect to the surface treatment composition). That is, the content (concentration) of the antifungal agent (antiseptic agent) in the surface treatment composition is preferably 0.0001 mass % or more and 5 mass % or less, more preferably 0.001 mass % or more and 1 mass % or less, still more preferably 0.005 mass % or more and 0.5 mass % or less, and particularly preferably 0.01 mass % or more and 0.1 mass % or less, with respect to 100 mass % of the total mass of the surface treatment composition (with respect to the surface treatment composition). Within such a range, an effect sufficient to inactivate or destroy a microorganism(s) can be obtained. When the surface treatment composition contains two or more types of antifungal agents (antiseptic agents), the above content is intended to be a total amount thereof.

That is, in an embodiment of the present invention, the surface treatment composition is substantially composed of a polymer (as the component (A)), a buffer (as the component (B)), a pH adjusting agent and water, and at least one selected from the group consisting of an antifungal agent, an organic solvent, a surfactant, and a chelating agent. In an embodiment of the present invention, the surface treatment composition is substantially composed of a polymer (as the component (A)), a buffer (as the component (B)), a pH adjusting agent and water, and at least one of an antifungal agent and an organic solvent. In an embodiment of the present invention, the surface treatment composition is substantially composed of a polymer (as the component (A)), a buffer (as the component (B)), a pH adjusting agent, and water. In the embodiments, the phrase "the surface treatment composition is substantially composed of X" means that a total content of X exceeds 99 mass % (upper limit: 100 mass %) with respect to 100 mass % of the total mass of the surface treatment composition (with respect to the surface treatment composition). Preferably, the surface treatment composition is composed of X (the total content=100 mass %). For example, the phrase "the surface treatment composition is substantially composed of a polymer (as the component (A)), a buffer (as the component (B)), a pH adjusting agent and water, and at least one of an antifungal agent and an organic solvent" means that a total content of a polymer (as the component (A)), a buffer (as the component (B)), a pH adjusting agent and water, and an antifungal agent and an organic solvent exceeds 99 mass % (upper limit: 100 mass %) with respect to 100 mass % of the total mass of the surface treatment composition (with respect to the surface treatment composition). The surface treatment composition is preferably composed of a polymer (as the component (A)), a buffer agent (component (B)), a pH adjusting agent and water, and at least one of an antifungal agent and an organic solvent (total content=100 mass %).

For further improving the effect of removing residues (foreign substances), the surface treatment composition according to the present invention preferably does not substantially contain abrasive grains. As used herein, the phrase "does not substantially contain abrasive grains" means that a content of abrasive grains with respect to the surface treatment composition is less than 0.01 mass %. That is, in an embodiment of the present invention, a content of abrasive grains is less than 0.01 mass % (lower limit: 0 mass %) with respect to 100 mass % of the total mass of the surface treatment composition (with respect to the surface treatment composition).

Method for Producing Surface Treatment Composition

A method for producing the surface treatment composition according to the present invention is not particularly limited. For example, the surface treatment composition can be obtained by stirring and mixing the component (A) (polymer), the component (B) (buffer), and as necessary, at least one selected from the group consisting of a pH adjusting agent, a surfactant, a chelating agent, water, an organic solvent, an antifungal agent (antiseptic agent), and other additive(s). In an embodiment of the present invention, the surface treatment composition according to the present invention is produced by stirring and mixing a polymer (as the component (A)), a buffer (as the component (B)), a pH adjusting agent, water, and at least one selected from the group consisting of an antifungal agent, an organic solvent, a surfactant, and a chelating agent. In an embodiment of the present invention, the surface treatment composition according to the present invention is produced by stirring and mixing a polymer (as the component (A)), a buffer (as the component (B)), a pH adjusting agent, water, and at least one of an antifungal agent and an organic solvent. In an embodiment of the present invention, the surface treatment composition according to the present invention is produced by stirring and mixing the component (A) (polymer), the component (B) (buffer), water, and a pH adjusting agent. A temperature at which each component is mixed is not particularly limited, but is preferably 10° C. or higher and 40° C. or lower, and heating may be performed in order to increase a dissolution rate. A mixing time is also not particularly limited.

Surface Treatment Method

With the surface treatment composition according to the present invention, residues remaining on a surface of a polished object can be sufficiently removed. In addition, an etching rate for a polished object containing polycrystalline silicon can be suppressed to be low. Therefore, the present invention is to provide a surface treatment method including subjecting a polished object to surface treatment using the surface treatment composition according to the present invention. Here, the polished object may contain at least one selected from the group consisting of silicon nitride, silicon oxide, and polysilicon. That is, the present invention is to provide a surface treatment method including subjecting a polished object containing at least one selected from the group consisting of silicon nitride, silicon oxide, and polysilicon to surface treatment using the surface treatment composition according to the present invention, to reduce residues on a surface of the polished object. As used herein, the term "surface treatment method" refers to a method of reducing residues on a surface of a polished object, and is a method of cleaning in a broad sense.

With the surface treatment method according to the present invention, residues remaining on a surface of a polished object can be sufficiently removed. That is, the present invention also is to provide a method for reducing residues on a surface of a polished object, the method including subjecting the polished object to surface treatment using the surface treatment composition according to the present invention. In addition, the present invention is to provide a method for reducing residues on a surface of a polished object, the method including subjecting the polished object containing at least one selected from the group consisting of silicon nitride, silicon oxide, and polysilicon to surface treatment using the surface treatment composition according to the present invention.

The surface treatment method according to the present invention is performed by directly contacting the polished object with the surface treatment composition according to the present invention.

Examples of the surface treatment method mainly include (I) a method of performing the surface treatment by rinse polishing treatment, and (II) a method of performing the surface treatment by cleaning treatment. That is, in an embodiment of the present invention, the surface treatment method is a rinse polishing treatment method or a cleaning treatment method (the surface treatment is performed by rinse polishing treatment or cleaning treatment). The rinse polishing treatment and the cleaning treatment can be performed in order to remove foreign substances (abrasive grain (particle) residues, organic residues such as a polymer(s) and pad debris, metal contaminants, and the like) on a surface of a polished object and to obtain a clean surface. Hereinafter, the (I) and (II) methods will be described.

(I) Rinse Polishing Treatment

The surface treatment composition according to the present invention can be suitably used in rinse polishing treatment. That is, the surface treatment composition according to the present invention can be preferably used as a composition for rinse polishing. The rinse polishing treatment is performed on a polishing table (platen) to which a polishing pad is attached for the purpose of removing foreign substances on a surface of a polished object after final polishing (finish polishing) is performed on an object to be polished to obtain the polished object. The rinse polishing treatment may be performed by bringing the surface treatment composition according to the present invention into direct contact with the polished object. As a result, foreign substances on the surface of the polished object can be removed by frictional force (physical action) by the polishing pad and chemical action by the surface treatment composition. Among the foreign substances, particularly, abrasive grain (particle) residues and organic residues can be easily removed by the physical action. Therefore, in the rinse polishing treatment, abrasive grain (particle) residues and organic residues can be effectively removed by using friction with the polishing pad on the polishing table (platen).

That is, in the present description, the rinse polishing treatment, the rinse polishing method, and the rinse polishing step respectively refer to a treatment, a method, and a step of reducing residues on the surface of an object to be subjected to surface treatment using a polishing pad.

Specifically, the rinse polishing treatment can be performed by placing a polished object after the polishing step on a polishing table (platen) of a polishing apparatus, and relatively sliding the polished object and the polishing pad while the polishing pad and the polished semiconductor substrate are brought into contact with each other and the surface treatment composition is supplied to the contact portion.

As the polishing apparatus, a general polishing apparatus can be used that includes a holder for holding an object to be polished, a motor having a changeable rotation number or the like, and a polishing table to which a polishing pad (polishing cloth) can be attached.

The rinse polishing treatment can be performed using either a single-side polishing apparatus or a double-side polishing apparatus. In addition, the polishing apparatus preferably includes a nozzle for discharging the surface treatment composition in addition to a nozzle for discharging a polishing composition. Operating conditions of the polishing apparatus during the rinse polishing treatment are not particularly limited, and those skilled in the art can appropriately select the operating conditions.

As the polishing pad, a general non-woven fabric, polyurethane, a porous fluororesin, or the like can be used without any particular limitation. The polishing pad is preferably subjected to groove processing such that the surface treatment composition is accumulated in the grooves.

Rinse polishing conditions are also not particularly limited. For example, the rotation number of a polishing table and the rotation number of a head (carrier) are preferably 10 rpm (0.17 s$^{-1}$) or more and 100 rpm (1.67 s$^{-1}$) or less, and a pressure (polishing pressure) applied to a polished object is preferably 0.5 psi (3.4 kPa) or more and 10 psi (68.9 kPa) or less. A method for supplying the surface treatment composition to a polishing pad is not particularly limited. For example, a method in which the surface treatment composition is continuously supplied using a pump or the like can be employed (continuously pouring without recycle). A supply amount of the surface treatment composition is not limited, but preferably is such that a surface of a polishing pad is always covered with the surface treatment composition. A supply amount is preferably 10 mL/min or more and 5,000 mL/min or less. A rinse polishing time is also not particularly limited, but is preferably 5 seconds or more and 180 seconds or less.

After the rinse polishing treatment with the surface treatment composition according to the present invention, a polished object (object to be subjected to surface treatment) is preferably pulled up and taken out while the surface treatment composition according to the present invention is applied thereto.

(II) Cleaning Treatment

The surface treatment composition according to the present invention may be used in cleaning treatment. That is, the surface treatment composition according to the present invention can be preferably used as a composition for cleaning. The cleaning treatment is preferably performed for the purpose of removing foreign substances on a surface of a polished object (object to be cleaned) after an object to be polished is subjected to final polishing (finish polishing) and then to the rinse polishing treatment or to another rinse polishing treatment using a composition for rinse polishing other than the surface treatment composition according to the present invention to obtain the polished object (object to be cleaned). It should be understood that the cleaning treatment and the rinse polishing treatment are classified according to places where these treatments are performed, i.e., the cleaning treatment is performed at a place other than a polishing table (platen), and is preferably performed after a polished object is removed from a polishing table (platen). Also in the cleaning treatment, foreign substances on a surface of a polished object can be removed by bringing the surface treatment composition according to the present invention into direct contact with the polished object.

Examples of the method of performing cleaning treatment may include: (i) a method of bringing a cleaning brush into contact with one surface or both surfaces of a polished object while holding the polished object, and rubbing the surface of an object to be cleaned with the cleaning brush while supplying the surface treatment composition to the contact portion; (ii) a method of immersing a polished object in the surface treatment composition, and performing ultrasonic treatment or stirring (dip method); and the like. In such a method, foreign substances on the surface of the polished object can be removed by frictional force by the cleaning brush, mechanical force generated by the ultrasonic treatment or stirring, and chemical action by the surface treatment composition.

In the method (i), the method of bringing the surface treatment composition into contact with the polished object is not particularly limited. Examples thereof may include a spin method involving rotating a polished object at a high speed while pouring the surface treatment composition onto the polished object from a nozzle, a spray method involving spraying the surface treatment composition onto a polished object to perform cleaning, and the like.

From the viewpoint of more efficiently removing contamination in a short time, it is preferable to employ the spin method or the spray method for the cleaning treatment, and the spin method is more preferable.

Examples of an apparatus for performing such a cleaning treatment may include a batch-type cleaning apparatus for simultaneously subjecting a plurality of polished objects accommodated in a cassette to surface treatment, a single wafer cleaning apparatus for subjecting a single polished object to surface treatment with the single polished object attached to a holder, and the like. From the viewpoint of shortening a cleaning time and the like, a method using a single wafer cleaning apparatus is preferable.

Further, as an apparatus for performing cleaning treatment, a polishing apparatus including a cleaning equipment for rubbing, with a cleaning brush, a polished object that has been removed from a polishing table (platen) may be exemplified. By using such a polishing apparatus, the cleaning treatment of a polished object can be more efficiently performed.

As such a polishing apparatus, a general polishing apparatus including a holder for holding a polished object, a motor having a changeable rotation number, a cleaning brush, and the like can be used. As a polishing apparatus, either a single-side polishing apparatus or a double-side polishing apparatus may be used. When the rinse polishing step is performed after a CMP step, it is more efficient and preferable to perform the cleaning treatment using the same apparatus as the polishing apparatus used in the rinse polishing step.

The cleaning brush is not particularly limited, but is preferably a resin brush. A material of the resin brush is not particularly limited, but is preferably PVA (polyvinyl alcohol). The cleaning brush is more preferably a PVA sponge.

Cleaning conditions are also not particularly limited, and can be appropriately set according to a type of an object to be subjected to surface treatment (polished object) and a type and amount of residues to be removed. For example, the rotation number of a cleaning brush is preferably 10 rpm $(0.17\ s^{-1})$ or more and 200 rpm $(3.33\ s^{-1})$ or less, and the rotation number of an object to be cleaned is preferably 10 rpm $(0.17\ s^{-1})$ or more and 100 rpm $(1.67\ s^{-1})$ or less. A method for supplying the surface treatment composition to a cleaning brush is not particularly limited. For example, a method in which the surface treatment composition is continuously supplied using a pump or the like can be employed (continuously pouring without recycle). A supply amount of the surface treatment composition is not limited, but preferably is such that surfaces of a cleaning brush and an object to be cleaned are always covered with the surface treatment composition. The supply amount is preferably 10 mL/min or more and 5,000 mL/min or less. A cleaning time is also not particularly limited, but is preferably 5 seconds or more and 180 seconds or less in the step of using the surface treatment composition according to an embodiment of the present invention. Within such a range, the foreign substances can be more effectively removed.

A temperature of the surface treatment composition during the cleaning is not particularly limited. The temperature may be usually room temperature, but may be raised to about 40° C. or higher and 70° C. or lower as long as the performance is not impaired.

In the method (ii), conditions of the cleaning method by immersion are not particularly limited, and a known method can be used.

Cleaning with water may be performed before the surface treatment by the method (I) or (II).

Post-Cleaning Treatment

In the surface treatment method, it is preferable to further subject a polished object to cleaning treatment after the surface treatment (I) or (II) using the surface treatment composition according to the present invention. In the present description, this cleaning treatment is referred to as "post-cleaning treatment". The post-cleaning treatment is not particularly limited, and examples thereof may include a method of simply pouring water onto the object to be subjected to surface treatment, a method of simply immersing the object to be subjected to surface treatment in water, and the like. Similarly to the surface treatment by the method (II) as described above, examples of the post-cleaning treatment may include a method (brush cleaning) of bringing a cleaning brush into contact with one surface or both surfaces of an object to be subjected to surface treatment while holding the object to be subjected to surface treatment, and rubbing a surface of the object to be subjected to surface treatment with the cleaning brush while supplying water or an aqueous solution (for example, $NH_3$ aqueous solution) to a contact portion therebetween, or supplying water and an aqueous solution (for example, $NH_3$ aqueous solution) to the contact portion in any order (supplying water and then supplying the aqueous solution or supplying the aqueous solution and then supplying water), a method (dip method) of immersing an object to be subjected to surface treatment in water and performing ultrasonic treatment or stirring, and the like. Among these methods, a method of bringing a cleaning brush into contact with one surface or both surfaces of an object to be subjected to surface treatment with the object to be subjected to surface treatment in a held state, and rubbing a surface of the object to be subjected to surface treatment with the cleaning brush while supplying water or an aqueous solution (for example, $NH_3$ aqueous solution) to a contact portion therebetween, or supplying water and an aqueous solution (for example, $NH_3$ aqueous solution) to the contact portion in any order (supplying water and then supplying the aqueous solution or supplying the $NH_3$ aqueous solution and then supplying water) is preferably used. As an apparatus and conditions for the post-cleaning treatment, the description of the surface treatment in (II) described above can be referred to. Here, as water used for the post-cleaning treatment, deionized water is particularly preferably used.

By performing the surface treatment with the surface treatment composition according to an embodiment of the present invention, residues can be extremely easily removed. Therefore, by the surface treatment with the surface treatment composition according to an embodiment of the present invention followed by an additional cleaning treatment using water, the residues can be extremely more favorably removed. Deionized water is particularly preferred as the water used in this process.

Method of Producing Semiconductor Substrate

The surface treatment method according to the present invention can be suitably applied when the polished object is a polished semiconductor substrate. That is, the present invention also is to provide a method for producing a semiconductor substrate, in which a polished object is a polished semiconductor substrate, the method including reducing residues on a surface of the polished semiconductor substrate by the surface treatment method.

The polished object contains at least one of silicon nitride, silicon oxide, or polysilicon. That is, the present invention also is to provide a method for producing a semiconductor substrate, in which a polished object is a polished semiconductor substrate, the method including: a polishing step of polishing a semiconductor substrate before polishing containing at least one selected from the group consisting of silicon nitride, silicon oxide, and polysilicon, using a polishing composition containing abrasive grains to obtain a polished semiconductor substrate; and a surface treatment step of reducing residues including the abrasive grains on a surface of the polished semiconductor substrate, using the surface treatment composition according to the present invention.

The details of the semiconductor substrate to which such a production method is applied are as described for the polished object which is to be subjected to surface treatment with the surface treatment composition.

In addition, the method for producing a semiconductor substrate is not particularly limited as long as the method includes a step of subjecting a surface of a polished semiconductor substrate to surface treatment using the surface treatment composition according to the present invention (surface treatment step). Examples of such a production method may include a method including a polishing step for forming a polished semiconductor substrate and a cleaning step. Another example is a method including a rinse polishing step between the polishing step and the cleaning step in addition to the polishing step and the cleaning step. Each of these steps will be described below.

Polishing Step

The polishing step that can be included in the method for producing a semiconductor substrate is a step of polishing a semiconductor substrate to obtain a polished semiconductor substrate.

The polishing step is not particularly limited as long as it is a step of polishing a semiconductor substrate, but is preferably a chemical mechanical polishing (CMP) step. The polishing step may be a polishing step composed of a single step, or may be a polishing step composed of a plurality of steps. Examples of the polishing step composed of a plurality of steps may include a step of performing a finish polishing step after a preliminary polishing step (rough polishing step), a step of performing one or two or more secondary polishing steps after a primary polishing step and then performing a finish polishing step, and the like. The surface treatment step using the surface treatment composition according to the present invention is preferably performed after the finish polishing step.

As the polishing composition, a known polishing composition can be appropriately used according to characteristics of the semiconductor substrate. The polishing composition is not particularly limited, and examples thereof may include a polishing composition containing abrasive grains, a water-soluble polymer, a pH adjusting agent, and a solvent, and the like.

The abrasive grains may be any of inorganic particles, organic particles, and organic-inorganic composite particles. Specific examples of the inorganic particles may include particles of metal oxides such as silica, alumina, ceria, and titania, silicon nitride particles, silicon carbide particles, and boron nitride particles. Specific examples of the organic particles may include polymethyl methacrylate (PMMA) particles. As the abrasive grains, commercially available products or synthesized products may be used. Unless otherwise specified in the present description, the abrasive grains refer to those which are not surface-modified. The abrasive grains may be used singly or two or more types thereof may be used in combination. Among these abrasive grains, silica particles are preferable, and colloidal silica particles are more preferable.

A lower limit of an average primary particle size of abrasive grains is preferably 10 nm or more, more preferably 15 nm or more, still more preferably 20 nm or more, and particularly preferably 30 nm or more. Within such a range, a high polishing speed can be maintained, and therefore the polishing composition can be suitably used in the rough polishing step. Further, an upper limit of an average primary particle size of abrasive grains is preferably 200 nm or less, more preferably 150 nm or less, and still more preferably 100 nm or less. In some embodiments, the average primary particle size may be 75 nm or less, 60 nm or less, or 50 nm or less. Within such a range, the occurrence of defects on a surface of a polished object after polishing can be further suppressed. The average primary particle size of abrasive grains is calculated, for example, based on a specific surface area of abrasive grain measured by a BET method.

A lower limit of an average secondary particle size of abrasive grains is preferably 15 nm or more, more preferably 30 nm or more, still more preferably 40 nm or more, still even more preferably 50 nm or more, and particularly preferably 60 nm or more. Within such a range, a high polishing speed can be maintained. Further, an upper limit of an average secondary particle size of abrasive grains is preferably 300 nm or less, more preferably 200 nm or less, still more preferably 150 nm or less, still even more preferably 100 nm or less, and particularly preferably 80 nm or less. Within such a range, the occurrence of defects on a surface of a polished object after polishing can be further suppressed. The average secondary particle size of abrasive grains can be measured by a dynamic light scattering method. The average secondary particle size can be measured with, for example, model "FPAR-1000" manufactured by Otsuka Electronics Co., Ltd. or an equivalent product thereof.

When the polishing composition is used as a polishing liquid as it is, a content of abrasive grains is preferably 0.1 mass % or more, more preferably 0.4 mass % or more, and still more preferably 1.0 mass % or more, with respect to the polishing composition. Increased abrasive grain content improves a polishing speed. Further, when the polishing composition is used as a polishing liquid as it is, a content of abrasive grains is usually appropriately 10 mass % or less, preferably 5 mass % or less, more preferably 3 mass % or less, and still more preferably 2 mass % or less, from the viewpoint of scratch prevention and the like. It is also preferable from the viewpoint of economic efficiency to reduce the content of abrasive grains. When two or more types of abrasive grains are used in combination, the content refers to a total content of two or more types of abrasive grains.

Examples of the water-soluble polymer may include cellulose derivatives, starch derivatives, polymers containing an oxyalkylene unit, polymers containing a nitrogen atom, vinyl alcohol-based polymers, and the like. Specific examples thereof may include hydroxyethyl cellulose, pullulan, random copolymers and block copolymers of ethylene oxide and propylene oxide, polyvinyl alcohol, acetalized polyvinyl alcohol, copolymers of vinyl alcohol and alkylene oxide, polyisoprenesulfonic acid, polyvinyl sulfonic acid, polyallyl sulfonic acid, polyisoamylene sulfonic acid, polystyrene sulfonate, polyacrylate, polyvinyl acetate, polyethylene glycol, polyvinyl imidazole, polyvinylcarbazole, polyvinylpyrrolidone, polyvinylcaprolactam, polyvinylpiperidine, polyacryloylmorpholine, polyhydroxyacrylamide, and the like. The water-soluble polymer can be used singly or two or more types thereof can be used in combination. The polishing composition disclosed herein can be preferably used even in the form of substantially not containing a water-soluble polymer, that is, in the form of at least intentionally not containing a water-soluble polymer.

When the polishing composition is used as a polishing liquid as it is, a content of the water-soluble polymer is preferably 0.01 mass % or more, more preferably 0.1 mass % or more, and still more preferably 0.2 mass % or more, with respect to the polishing composition. When the polishing composition is used as a polishing liquid as it is, a content of the water soluble polymer is preferably 3 mass % or less, more preferably 2 mass % or less, and still more preferably 1 mass % or less. When two or more types of water-soluble polymers are used in combination, the content refers to a total content of two or more types of water-soluble polymers.

The pH adjusting agent and the solvent are the same as defined in the sections of [pH adjusting agent] and [Solvent] described above, respectively, and thus the descriptions thereof are omitted here. Among these, the pH adjusting agent is preferably potassium hydroxide, sodium hydroxide, or ammonia, and more preferably ammonia. The solvent preferably contains water, and is more preferably only water.

When the polishing composition is used as a polishing liquid as it is, pH of the polishing composition is preferably higher than that of the surface treatment composition according to the present invention (more than 8.0). The pH of the polishing composition is more preferably 8.5 or more, still more preferably 9.5 or more, and particularly preferably 10.0 or more. When the pH of the polishing composition increases, a polishing speed increases. Meanwhile, when the polishing composition is used as a polishing liquid as it is, pH of the polishing composition is preferably 12.0 or less, and more preferably 11.5 or less. When the pH of the polishing composition is 12.0 or less, it is possible to suppress dissolution of the abrasive grains and to prevent decrease in mechanical polishing action by the abrasive grains. The pH of the polishing composition is measured by the method described in Examples.

As an polishing apparatus, a general polishing apparatus can be used that includes a holder for holding an object to be polished, a motor having a changeable rotation number or the like, and a polishing table to which a polishing pad (polishing cloth) can be attached. As a polishing apparatus, either a single-side polishing apparatus or a double-side polishing apparatus may be used.

As the polishing pad, a general non-woven fabric, polyurethane, a porous fluororesin, or the like can be used without any particular limitation. The polishing pad is preferably subjected to groove processing such that the polishing liquid is accumulated in the grooves.

Polishing conditions are also not particularly limited. For example, the rotation number of a polishing table and the rotation number of a head (carrier) are preferably 10 rpm (0.17 s$^{-1}$) or more and 100 rpm (1.67 s$^{-1}$) or less, and a pressure (polishing pressure) applied to an object to be polished is preferably 0.5 psi (3.4 kPa) or more and 10 psi (68.9 kPa) or less. A method for supplying a polishing composition to a polishing pad is not particularly limited. For example, a method in which a polishing composition is continuously supplied using a pump or the like can be employed (continuously pouring without recycle). A supply amount of the polishing composition is not limited, but preferably is such that a surface of a polishing pad is always covered with the polishing composition. A supply amount is preferably 10 mL/min or more and 5,000 mL/min or less. A polishing time is also not particularly limited, but is preferably 5 seconds or more and 180 seconds or less in a step of using the polishing composition.

Surface Treatment Step

The surface treatment step refers to a step of reducing residues on a surface of a polished object using the surface treatment composition according to the present invention. In the method for producing a semiconductor substrate, after a rinse polishing step, a cleaning step as a surface treatment step may be performed, or only a rinse polishing step or only a cleaning step may be performed.

Rinse Polishing Step

The rinse polishing step may be provided between the polishing step and the cleaning step in the method for producing a semiconductor substrate. The rinse polishing step is a step of reducing foreign substances on a surface of a polished object (polished semiconductor substrate) by the surface treatment method (rinse polishing treatment method) according to an embodiment of the present invention.

Details of the rinse polishing method used in the rinse polishing step are as described in the description regarding the rinse polishing treatment.

Cleaning Step

The cleaning step may be provided after the polishing step or may be provided after the rinse polishing step in the method for producing a semiconductor substrate. The cleaning step is a step of reducing foreign substances on a surface of a polished object (polished semiconductor substrate) by the surface treatment method (cleaning method) according to an embodiment of the present invention.

Details of the cleaning method used in the cleaning step are the same as those in the above (post-cleaning treatment).

Although embodiments of the invention have been described in detail, it should be understood that they are illustrative and exemplary, not limiting, and that the scope of the invention should be interpreted by the appended claims.

The present invention encompasses the following aspects and forms.

1. A surface treatment composition, comprising a component (A); and a component (B), wherein pH of the composition is 8.0 or more:
  Component (A): a polymer having a constituent unit having a quaternary nitrogen-containing onium salt or a constituent unit of a structure (X) below:

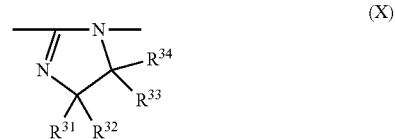

wherein $R^{31}$ to $R^{34}$ each independently represent a hydrogen atom, or a linear or branched alkyl group having from 1 to 10 carbon atoms,
  Component (B): a buffer represented by a formula: R—COO$^-$NH$_4^+$, wherein R is a linear or branched alkyl group having from 1 to 10 carbon atoms, or a phenyl group;

2. The surface treatment composition according to the above 1., wherein the component (A) contains a polymer having a constituent unit having a quaternary nitrogen-containing onium salt.

3. The surface treatment composition according to the above 1. or 2., wherein the constituent unit having a quaternary nitrogen-containing onium salt is only a structure (Y) or a structure (Z) below:

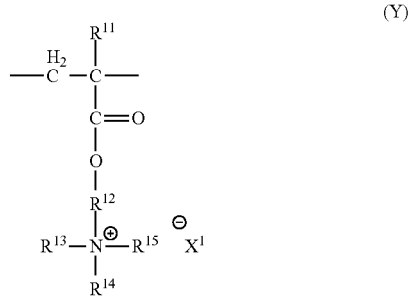

(Y)

wherein $R^{11}$ represents a hydrogen atom or a methyl group, $R^{12}$ represents a linear or branched alkylene group having from 1 to 10 carbon atoms, $R^{13}$ to $R^{15}$ each independently represent a linear or branched alkyl group having from 1 to 10 carbon atoms, and $X^1$ represents an anion moiety,

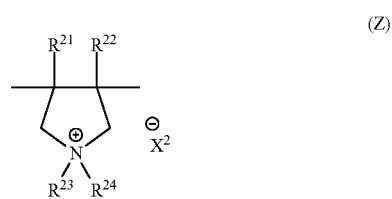

(Z)

wherein $R^{21}$ and $R^{22}$ each independently represent a hydrogen atom, an alkyl group having from 1 to 3 carbon atoms, or a phenyl group, $R^{23}$ and $R^{24}$ each independently represent a linear or branched alkyl group having from 1 to 10 carbon atoms, and $X^2$ represents an anion moiety;

4. The surface treatment composition according to any of the above 1. to 3., wherein the surface treatment composition contains substantially no abrasive grains;

5. The surface treatment composition according to any of the above 1. to 4., wherein the polymer is contained at a proportion of more than 0.05 mass % with respect to the surface treatment composition;

6. The surface treatment composition according to any of the above 1. to 5., wherein the buffer is ammonium acetate;

7. The surface treatment composition according to any of the above 1. to 6., further comprising a component (C):
Component (C): a pH adjusting agent;

8. The surface treatment composition according to the above 7., wherein the pH adjusting agent is ammonia;

9. A surface treatment method comprising subjecting a polished object containing at least one selected from the group consisting of silicon nitride, silicon oxide, and polysilicon to surface treatment using the surface treatment composition according to any of the above 1. to 8., to reduce a residue on a surface of the polished object;

10. The surface treatment method according to the above 9., wherein the surface treatment is carried out by a rinse polishing treatment method or a cleaning treatment method;

11. A method for producing a semiconductor substrate, wherein a polished object is a polished semiconductor substrate, which comprises:
    polishing a semiconductor substrate before polishing containing at least one selected from the group consisting of silicon nitride, silicon oxide, and polysilicon, using a polishing composition containing an abrasive grain to obtain a polished semiconductor substrate; and
    reducing a residue including the abrasive grain on a surface of the polished semiconductor substrate, using the surface treatment composition according to any of the above 1. to 8.; and 12. The method according to the above 11., wherein a pH of the polishing composition is 8.5 or more.

EXAMPLES

The present invention will be described in more detail with reference to the following Examples and Comparative Examples. However, the technical scope of the present invention is not limited only to the following Examples. Unless otherwise stated, "%" and "part" respectively means "mass %" and "parts by mass". In the following Examples, unless otherwise noted, operations were performed under the conditions of room temperature (25° C.)/relative humidity of 40% RH or more and 50% RH or less.

Component (A), Component (B), and pH Adjusting Agent

The following components (A) and (B) and a pH adjusting agent were provided.

Component (A)

Dimethyldiallylammonium chloride/acrylic acid copolymer (DADMAC/AA): Merquat (trade mark) 295 Polymer (The Lubrizol Corporation) (Polyquaternium-22), Mw: 190,000 (also referred to as "DADMAC/AA")

Dimethyldiallylammonium chloride/acrylamide copolymer (DADMAC/Aam): Merquat (trade mark) 550 Polymer (The Lubrizol Corporation) (Polyquaternium-7), Mw: 1,600,000 (also referred to as "DADMAC/Aam")

Polydimethyldiallylammonium chloride (polydimethylmethylene piperidinium chloride) (poly-DADMAC): Unisense FPA-100L (Senka Corporation), Mw: less than 20,000 (also referred to as "poly-DADMAC 1")

Polydimethyldiallylammonium chloride (polydimethylmethylene piperidinium chloride) (poly-DADMAC): Unisense FPA-102L (Senka Corporation), Mw: 20,000 to 100,000 (also referred to as "poly-DADMAC 2")

Polydimethyldiallylammonium chloride (polydimethylmethylene piperidinium chloride) (poly-DADMAC): Unisense FPA-1000L (Senka Corporation), Mw: 100,000 to 500,000 (also referred to as "poly-DADMAC 3")

Polyalkylene polyamine/dicyandiamide ammonium salt condensate (dicyandiamide (DCDA)/diethylenetriamine (DETA)): Unisense KHP10P (Senka Corporation), Mw: less than 20,000 (also referred to as "DCDA/DETA")

Methacryloyl ethyl dimethyl betaine/methacryloyl ethyl trimethylammonium chloride/methoxy polyethylene glycol methacrylate copolymer (DMA/PMMP/Betaine): Plascize L-440W (Goo Chemical Co., Ltd.) (Polyquaternium-49) (also referred to as "DMA/PMMP/Betaine"), Mw: N/A Methacryloyl ethyl dimethyl betaine/methacryloyl ethyl trimethylammonium chloride/2-hydroxyethyl methacrylate copolymer (DMA/HEMA/Betaine): Plascize L-450W (Goo Chemical Co., Ltd.) (Polyquaternium-48) (also referred to as "DMA/HEMA/Betaine"), Mw: N/A Vinylpyrrolidone/N,N-dimethylaminoethyl methacrylic acid copolymer diethyl sulfate (DMA/VP): H.C. Polymer 1S (M) (Osaka Organic Chemical Industry Ltd.) (Polyquaternium-11), Mw: 500,000 (also referred to as "DMA/VP1")

Vinylpyrrolidone/N,N-dimethylaminoethyl methacrylic acid copolymer diethyl sulfate (DMA/VP): H.C. Polymer 5W (Osaka Organic Chemical Industry Ltd.) (Polyquaternium-11), Mw: 150,000 (also referred to as "DMA/VP2")

Polyvinyl alcohol (PVA): JMR-10HH (JAPAN VAM & POVAL Co., Ltd.), Mw: 10,000 (also referred to as "PVA")

Polyvinylpyrrolidone (PVP): PITZCOL (registered trademark) K-30A (DKS Co. Ltd.), Mw: 45,000 (also referred to as "PVP")

Poly-ε-L-lysine: Poly epsilon L-lysine HCl (Carbosynth), Mw: 4,000 (also referred to as "poly-s-L-lysine")

Chitosan hydroxypropyltrimonium chloride: Moiscoat PX (Katakura & Co-op Agri Corporation), Mw: N/A (also referred to as "Chitosan PX")

L-Lysine: L-Lysine (FUJIFILM Wako Pure Chemical Corporation), Mw: 146 (also referred to as "L-Lysine")

L-Arginine: L-(+)-Arginine (FUJIFILM Wako Pure Chemical Corporation), Mw: 174 (also referred to as "L-Arginine")

Polyethyleneimine: EPOMIN (registered trademark) SP-003 (Nippon Shokubai Co., Ltd.), Mw: 300 (also referred to as "PEI 1")

Polyethyleneimine: EPOMIN (registered trademark) SP-200 (Nippon Shokubai Co., Ltd.), Mw: 10,000 (also referred to as "PEI 2")

Polyethyleneimine: EPOMIN (registered trademark) P-1000 (Nippon Shokubai Co., Ltd.), Mw: 70,000 (also referred to as "PEI 3")

Component (B)

Ammonium acetate (Kanto Chemical Co., Inc.), molecular weight: 77

Diammonium hydrogen phosphate (FUJIFILM Wako Pure Chemical Corporation), molecular weight: 132

Ammonium hydrogen carbonate (FUJIFILM Wako Pure Chemical Corporation), molecular weight: 79 pH Adjusting Agent

Ammonia: EL ammonia water (concentration: 28.0% to 30.0% (as $NH_3$)) (Kanto Chemical Co., Inc.), molecular weight: 17

Potassium hydroxide: 48% potassium hydroxide aqueous solution (KOHLM, Kanto Chemical Co., Inc.), molecular weight: 56

Sodium hydroxide: 25% sodium hydroxide aqueous solution (Abutatsu-Shoten), molecular weight: 40

Measurement of Weight Average Molecular Weight (Mw)

A weight average molecular weight (Mw) of the component (A) was measured by the following method.

As the weight average molecular weight (Mw) of the component (A), a value of a weight average molecular weight (in terms of polyethylene glycol) measured by gel permeation chromatography (GPC) was used. The weight average molecular weight was measured with the following apparatus under the following conditions:

GPC apparatus: manufactured by Shimadzu Corporation

Model: Prominence+ELSD detector (ELSD-LTII)

Column: VP-ODS (manufactured by Shimadzu Corporation)

Mobile phase A: MeOH

B: 1% acetic acid aqueous solution

Flow rate: 1 mL/min

Detector: ELSD temp. 40° C., Gain 8, $N_2$ GAS 350 kPa

Oven temperature: 40° C.

Injection volume: 40 μL

Measurement of pH of Surface Treatment Composition pH of a surface treatment composition (liquid temperature: 25° C.) was confirmed by a pH meter (manufactured by HORIBA, Ltd., product name: LAQUA (registered trademark)).

Preparation of Surface Treatment Composition

Example 1

A dimethyldiallylammonium chloride/acrylic acid copolymer (Merquat (trade mark) 295 Polymer: DADMAC/AA) as component (A), ammonium acetate as component (B), ammonia as pH adjusting agent, and distilled water were stirred and mixed at 25° C. for 5 minutes, to prepare a surface treatment composition 1.

In this Example, a content of the component (A) was 0.1 mass % with respect to a total amount of the surface treatment composition 1, a content of the component (B) was 0.25 mass % with respect to the total amount of the surface treatment composition 1, and a content of the pH adjusting agent was set to an amount such that pH of the surface treatment composition 1 was 9.0. The surface treatment composition 1 does not contain abrasive grains (content of abrasive grains: 0 mass %).

Examples 2 to 16, Comparative Examples 1 to 14

Surface treatment compositions 2 to 16 and comparative surface treatment compositions 1 to 14 were prepared in the same manner as in Example 1 except that the types and contents of component (A), component (B), and pH adjusting agent were changed as described in the following Table 1. The surface treatment compositions 2 to 16 and comparative surface treatment compositions 1 to 14 do not contain abrasive grains (content of abrasive grains: 0 mass %).

TABLE 1

| | Component (A) | | | | Component (B) | | Component (A)/ Component (B) content ratio | pH adjusting agent | pH |
|---|---|---|---|---|---|---|---|---|---|
| | Compound | Molecular weight | Content mass % | Ionicity | Buffer | Content mass % | | | |
| Example 1 | DADMAC/AA | 190,000 | 0.1 | Cationic | Ammonium acetate | 0.25 | 0.4 | Ammonia | 9.0 |
| Example 2 | DADMAC/AA | 190,000 | 0.1 | Cationic | Ammonium acetate | 0.25 | 0.4 | Potassium hydroxide | 9.0 |
| Example 3 | DADMAC/AA | 190,000 | 0.1 | Cationic | Ammonium acetate | 0.25 | 0.4 | Sodium hydroxide | 9.0 |
| Example 4 | DADMAC/AA | 1,600,000 | 0.1 | Cationic | Ammonium acetate | 0.25 | 0.4 | Ammonia | 9.0 |
| Example 5 | poly-DADMAC 1 | Less than 20,000 | 0.1 | Cationic | Ammonium acetate | 0.25 | 0.4 | Ammonia | 9.0 |
| Example 6 | poly-DADMAC 2 | 20,000 to 100,000 | 0.1 | Cationic | Ammonium acetate | 0.25 | 0.4 | Ammonia | 9.0 |
| Example 7 | poly-DADMAC 3 | 100,000 to 500,000 | 0.1 | Cationic | Ammonium acetate | 0.25 | 0.4 | Ammonia | 9.0 |
| Example 8 | DCDA/DETA | Less than 20,000 | 0.1 | Cationic | Ammonium acetate | 0.25 | 0.4 | Ammonia | 9.0 |
| Example 9 | DMA/PMMP Betaine | N/A | 0.1 | Cationic | Ammonium acetate | 0.25 | 0.4 | Ammonia | 9.0 |
| Example 10 | DMA/HEMA Betaine | N/A | 0.1 | Cationic | Ammonium acetate | 0.25 | 0.4 | Ammonia | 9.0 |
| Example 11 | DMA/VP 1 | 500,000 | 0.1 | Cationic | Ammonium acetate | 0.25 | 0.4 | Ammonia | 9.0 |
| Example 12 | DMA/VP 2 | 150,000 | 0.1 | Cationic | Ammonium acetate | 0.25 | 0.4 | Ammonia | 9.0 |
| Example 13 | DADMAC/AA | 190,000 | 0.1 | Cationic | Ammonium acetate | 0.25 | 0.4 | Ammonia | 8.0 |
| Example 14 | poly-DADMAC 1 | Less than 20,000 | 0.1 | Cationic | Ammonium acetate | 0.25 | 0.4 | Ammonia | 8.0 |
| Example 15 | DADMAC/AA | 190,000 | 0.1 | Cationic | Ammonium acetate | 0.25 | 0.4 | Ammonia | 10.0 |
| Example 16 | poly-DADMAC 1 | Less than 20,000 | 0.1 | Cationic | Ammonium acetate | 0.25 | 0.4 | Ammonia | 10.0 |
| Comparative Example 1 | DADMAC/AA | 190,000 | 0.1 | Cationic | — | — | — | Ammonia | 9.0 |
| Comparative Example 2 | DADMAC/AA | 190,000 | 0.1 | Cationic | Diammonium hydrogen phosphate | 0.2 | 0.5 | Ammonia | 9.0 |
| Comparative Example 3 | DADMAC/AA | 190,000 | 0.1 | Cationic | Ammonium hydrogen carbonate | 0.23 | 0.4 | Ammonia | 9.0 |
| Comparative Example 4 | DADMAC/AA | 190,000 | 0.1 | Cationic | Ammonium acetate | 0.25 | 0.4 | Ammonia | 7.5 |
| Comparative Example 5 | poly-DADMAC 1 | Less than 20,000 | 0.1 | Cationic | Ammonium acetate | 0.25 | 0.4 | Ammonia | 7.5 |
| Comparative Example 6 | PVA | 10,000 | 0.1 | Nonionic | Ammonium acetate | 0.25 | 0.4 | Ammonia | 9.0 |
| Comparative Example 7 | PVP | 45,000 | 0.1 | Nonionic | Ammonium acetate | 0.25 | 0.4 | Ammonia | 9.0 |
| Comparative Example 8 | Poly-ε-L-lysine | 4000 | 0.1 | Cationic | Ammonium acetate | 0.25 | 0.4 | Ammonia | 9.0 |
| Comparative Example 9 | Chitosan PX | N/A | 0.1 | Cationic | Ammonium acetate | 0.25 | 0.4 | Ammonia | 9.0 |
| Comparative Example 10 | L-Lysine | 145 | 0.1 | Cationic | Ammonium acetate | 0.25 | 0.4 | Ammonia | 9.0 |
| Comparative Example 11 | L-Arginine | 174 | 0.1 | Cationic | Ammonium acetate | 0.25 | 0.4 | Ammonia | 9.0 |
| Comparative Example 12 | PEI 1 | 300 | 0.1 | Cationic | Ammonium acetate | 0.25 | 0.4 | Ammonia | 9.0 |
| Comparative Example 13 | PEI 2 | 10,000 | 0.1 | Cationic | Ammonium acetate | 0.25 | 0.4 | Ammonia | 9.0 |
| Comparative Example 14 | PEI 3 | 70,000 | 0.1 | Cationic | Ammonium acetate | 0.25 | 0.4 | Ammonia | 9.0 |

Preparation of Polished Object

Polished objects after being polished by the following chemical mechanical polishing (CMP) step (a polished SiN substrate and a polished Poly-Si substrate) were provided.

CMP Step

As objects to be polished, a silicon wafer (SiN substrate) (300 mm blanket wafer, manufactured by Advantech Co., Ltd.) having a SiN film of a thickness of 2,500 Å formed on the surface thereof by CVD, and a silicon wafer (Poly-Si substrate) (300 mm wafer, manufactured by Advanced Materials Technology) having a polycrystalline silicon film of a thickness of 5,000 Å formed on the surface thereof by CVD were provided.

The SiN substrate and the Poly-Si substrate were each polished using a polishing composition having the following composition under the following conditions, to obtain polished objects (polished SiN substrates and polished Poly-Si substrates).

Polishing Composition

A silica slurry (composition: 10 mass % of colloidal silica (average primary particle size: 35 nm, average secondary particle size: 70 nm), 0.25 mass % of polyvinylpyrrolidone (PITZCOL (registered trademark) K-30A, DKS Co. Ltd., Mw: 45,000), 0.33 mass % (as $NH_3$) of EL ammonia water (concentration: 28.0% to 30.0% (as $NH_3$) (Kanto Chemical Co., Inc.), and solvent: distilled water) was prepared. The silica slurry was diluted 5-times with distilled water to prepare a polishing composition. pH of the obtained polishing composition was 10.0.

Polishing Apparatus and Polishing Conditions

Polishing apparatus: F-REX300E manufactured by Ebara Corporation
Polishing pad: Foamed polyurethane pad manufactured by Fujibo Holdings Inc., H800-Type 1
Conditioner (dresser): Nylon brush (manufactured by 3M Company)
Polishing pressure: 2.0 psi (1 psi=6894.76 Pa, the same applies hereinafter)
Rotation number of polishing table: 80 rpm
Rotation number of head: 80 rpm
Supply of polishing composition: Continuously pouring without recycle
Supply amount of polishing composition: 200 mL/min
Polishing time: 30 seconds

Rinse Polishing

After each surface of the object to be polished (SiN substrate and Poly-Si substrate) was polished in the CMP step, a polished object (polished SiN substrate and polished Poly-Si substrate) was removed from the polishing table (platen). Subsequently, the polished object was mounted on another polishing table (platen) in the same polishing apparatus. The rinse polishing treatment was performed on a surface of the polished object using each of the surface treatment compositions prepared in Examples 1 to 16 and Comparative Examples 1 to 14 under the following conditions.

Rinse Polishing Apparatus and Rinse Polishing Conditions

Polishing apparatus: F-REX300E manufactured by Ebara Corporation
Polishing pad: Foamed polyurethane pad manufactured by Fujibo Holdings Inc., H800-Type 1
Conditioner (dresser): Nylon brush (manufactured by 3M Company)
Polishing pressure: 1.0 psi
Rotation number of table: 80 rpm
Rotation number of head: 80 rpm
Supply of surface treatment composition: Continuously pouring without recycle
Supply amount of surface treatment composition: 300 mL/min
Polishing time: 60 seconds

Post-Cleaning Treatment

After the rinse polishing treatment, a surface of each substrate was cleaned with a brush for 20 seconds using a 0.3% $NH_3$ aqueous solution, and then cleaned with deionized water for 40 seconds, to obtain a rinse-polished object (rinse-polished SiN substrates 1 to 16 obtained by using the surface treatment compositions 1 to 16 of Examples 1 to 16 and comparative rinse-polished SiN substrates 1 to 14 obtained by using the comparative surface treatment compositions 1 to 14 of Comparative Examples 1 to 14, and rinse-polished Poly-Si substrates 1 to 16 obtained by using the surface treatment compositions 1 to 16 of Examples 1 to 16 and comparative rinse-polished Poly-Si substrates 1 to 14 obtained by using the comparative surface treatment compositions 1 to 14 of Comparative Examples 1 to 14).

Evaluation

Residue Evaluation

Under alkaline conditions, many hydroxyl groups exist on a surface of a Poly-Si substrate, and a film of water is formed on the surface. Therefore, defects (for example, abrasive grain residues, and organic residues such as pad debris and polymers) hardly adhere or does not adhere to the surface of the Poly-Si substrate. On the other hand, defects (for example, abrasive grain residues, and organic residues such as pad debris and polymers) are likely to adhere onto a SiN substrate. Therefore, in this evaluation, the number of abrasive grain residues and the number of organic residues (pad debris, polymers, and the like) on the rinse-polished SiN substrate (SiN substrate after rinse polishing treatment) were measured according to the following method. The results are shown in the following Table 2 ("number of defects on SiN" in the table).

The number of residues on a surface of a rinse-polished SiN substrate (polished SiN substrate after rinse polishing treatment) was evaluated using an optical inspection machine Surfscan (registered trademark) SP5 manufactured by KLA-Tencor Corporation. Specifically, the number of residues having a diameter of more than 50 nm was counted for a remaining portion excluding a portion having a width of 5 mm from the outer peripheral end portion (a region from 0 mm to 5 mm when the outer peripheral end is 0 mm) of one surface of the rinse-polished SiN substrate. Thereafter, the number of abrasive grain residues and the number of organic residues were measured for the rinse-polished SiN substrate by SEM observation using Review SEM RS6000 manufactured by Hitachi High-Tech Corporation. First, 100 residues existing in the remaining portion excluding the portion having a width of 5 mm from the outer peripheral end portion of one surface of the rinse-polished SiN substrate were sampled by SEM observation. Next, the type of residue (abrasive grain or organic residue) was determined by visual SEM observation from among the sampled 100 residues. Then, the number of abrasive grain residues ($SiO_2$ residues) and the number of organic residues (pad debris, polymer(s), and the like) were respectively measured. The number of abrasive grain residues ($SiO_2$ residues) is preferably as small as possible, but it is acceptable when the number is 30 or less. The number is preferably 25 or less, and more preferably less than 20. The number of organic residues (pad debris, polymer(s), and the like) is also preferably as small as possible, but it is acceptable when the number is less than 15. The number is preferably 10 or less, and more preferably 5 or less. (Evaluation of zeta potential of abrasive grains)

A zeta potential of abrasive grains (colloidal silica, $SiO_2$) in each surface treatment composition was measured according to the following method. The results are shown in the following Table 2 ("zeta potential, abrasive grains [mV]" in the table).

The zeta potential of the abrasive grains was measured by Zetasizer Nano ZSP manufactured by Spectris Co., Ltd. (Malvern Panalytical). The zeta potential of the abrasive grains during rinse polishing using the surface treatment composition was a value measured by the following model experiment.

A silica ($SiO_2$) particle dispersion (colloidal silica, average primary particle size: 35 nm, average secondary particle size: 70 nm, 19.5 mass % aqueous dispersion) was added to each surface treatment composition so that a concentration of silica particles was 0.02 mass %, thereby preparing a measurement liquid having a silica particle concentration of 0.02 mass % (a content (concentration) of the silica particles in the measurement liquid was 0.02 mass % with respect to a total mass of the measurement liquid). The resultant measurement liquid was filled in a dedicated measurement cell of the apparatus (Zetasizer Nano ZSP), and a zeta potential (mV) of the abrasive grains was measured. It is acceptable when the zeta potential (mV) of the abrasive grains is 30 mV or more. (Evaluation of zeta potentials of SiN substrate and pad debris)

Zeta potentials of silicon nitride (SiN substrate) and pad debris (polyurethane) in each surface treatment composition were measured. The results are shown in the following Table 2 ("zeta potential, SiN [mV]" and "zeta potential, pad debris [mV]" in the table). It is presumed that a zeta potential of silicon nitride more greatly affects the effect of removing residues, as compared with a zeta potential of polycrystalline silicon. In this evaluation, therefore, the zeta potential of the SiN substrate in the surface treatment composition was measured.

The zeta potentials of the polished SiN substrate and the zeta potential of the pad debris are measured by an electrokinetic analyzer for solid surface analysis SurPASS3 (zeta potential analyzer) manufactured by Anton Paar Japan K.K. The zeta potential of a surface of a polished SiN substrate during rinse polishing using the surface treatment composition and the zeta potential of the pad debris during rinse polishing using the surface treatment composition were measured in the following model experiments, respectively.

In the measurement of the zeta potential of the surface of the polished SiN substrate, a silicon wafer (SiN substrate) (300 mm blanket wafer, manufactured by Advantech Co., Ltd.) having a SiN film of a thickness of 2,500 Å formed on the surface thereof by CVD was cut into a 60 mm square, to be used as an object to be measured.

In the measurement of the zeta potential of the pad debris, a polyurethane pad (foamed polyurethane pad, manufactured by Fujibo Holdings Inc., H800-Type 1) was cut into a 60 mm square, to be used as an object to be measured.

These objects to be measured were each placed on the zeta potential analyzer. Next, each the surface treatment composition prepared above was allowed to pass through each of the objects to be measured, and the zeta potentials (mV) of these objects to be measured were measured. It is acceptable when the zeta potentials of SiN substrate and pad debris are 30 mV or higher, respectively.

Evaluation of Etching Rate

An etching rate of a polished SiN substrate during rinse polishing using each surface treatment composition, and an etching rate of a polished Poly-Si substrate during rinse polishing using each surface treatment composition were measured in the following model experiment. These values are shown in the following Table 2 ("SiN [Å/min]" and "Poly-Si [Å/min]" in the table).

In the measurement of the etching rate of the polished SiN substrate, a silicon wafer (SiN substrate) (300 mm blanket wafer, manufactured by Advantech Co., Ltd.) having a SiN film of a thickness of 2,500 Å formed on the surface thereof by CVD was cut into a 60 mm square, to be used as an object to be measured.

In the measurement of the etching rate of the polished Poly-Si substrate, a silicon wafer (Poly-Si substrate) (300 mm, manufactured by Advanced Materials Technology) having a polycrystalline silicon film of a thickness of 5,000 Å formed on the surface thereof by CVD was cut into a 60 mm square, to be used as an object to be measured.

A thickness of each of these objects to be measured was measured with a spectroscopic film thickness measurement system (Lambda Ace VM-2030: manufactured by Dainippon Screen Mfg. Co., Ltd.) (thickness before immersion (Å)). Next, each of these objects to be measured was immersed in the surface treatment composition prepared above for 30 minutes. A thickness of each of the objects to be measured after immersion for a predetermined time was measured with a spectroscopic film thickness measurement system (Lambda Ace VM-2030: manufactured by Dainippon Screen Mfg. Co., Ltd.) (thickness after immersion (Å)). An etching rate [=(thickness before immersion (Å)−thickness after immersion) (Å)/immersion time (min)] was calculated by dividing a difference in thickness before and after immersion by the immersion time (min). The etching rates of the polished SiN substrate and the polished Poly-Si substrate are preferably as small as possible. An etching rate of less than 15 Å/min is acceptable. An etching rate is preferably less than 10 Å/min, and more preferably 5 Å/min or less.

Evaluation of ΔpH

A difference in pH (ΔpH) [=(pH of surface treatment composition after rinse polishing)−(pH of surface treatment composition before rinse polishing)] of the surface treatment composition before and after a SiN substrate as an object to be polished was subjected to the rinse polishing was determined. pH of the surface treatment composition before rinse polishing is pH of the surface treatment composition described in Table 1 above. These values are shown in the following Table 2 ("ΔpH [-]" in the table). Incidentally, ΔpH (change in pH before and after rinse polishing) is preferably as small as possible. ΔpH of less than 1.0 is acceptable. ΔpH is preferably less than 0.8, and more preferably less than 0.3.

TABLE 2

|  | Zeta potential | | | Number of defects on SiN | | | Etching rate | |
| --- | --- | --- | --- | --- | --- | --- | --- | --- |
|  | SiN [mV] | Abrasive grains [mV] | Pad debris [mV] | Abrasive grain residues (count) | Organic residues (count) | ΔpH [-] | Poly-Si [Å/min] | SiN [Å/min] |
| Example 1 | 57 | 51 | 40 | 15 | 2 | 0 | 1 | 0 |
| Example 2 | 35 | 38 | 30 | 21 | 10 | 0.8 | 10 | 0 |
| Example 3 | 33 | 39 | 29 | 20 | 10 | 0.8 | 11 | 0 |
| Example 4 | 36 | 35 | 38 | 18 | 5 | 0 | 1 | 0 |
| Example 5 | 35 | 38 | 35 | 23 | 3 | 0 | 3 | 0 |
| Example 6 | 39 | 45 | 40 | 28 | 7 | 0 | 5 | 0 |
| Example 7 | 45 | 48 | 49 | 29 | 8 | 0 | 3 | 0 |
| Example 8 | 37 | 36 | 35 | 29 | 8 | 0 | 5 | 0 |

TABLE 2-continued

| | Zeta potential | | | Number of defects on SiN | | | Etching rate | |
|---|---|---|---|---|---|---|---|---|
| | SiN [mV] | Abrasive grains [mV] | Pad debris [mV] | Abrasive grain residues (count) | Organic residues (count) | ΔpH [-] | Poly-Si [Å/min] | SiN [Å/min] |
| Example 9 | 35 | 38 | 39 | 28 | 6 | 0 | 5 | 0 |
| Example 10 | 35 | 36 | 35 | 27 | 9 | 0 | 6 | 0 |
| Example 11 | 35 | 37 | 35 | 29 | 8 | 0 | 2 | 0 |
| Example 12 | 36 | 35 | 37 | 28 | 9 | 0 | 2 | 0 |
| Example 13 | 50 | 51 | 33 | 20 | 4 | 0 | 0 | 0 |
| Example 14 | 36 | 32 | 37 | 27 | 3 | 0 | 2 | 0 |
| Example 15 | 52 | 50 | 40 | 17 | 3 | 0 | 7 | 0 |
| Example 16 | 34 | 30 | 35 | 26 | 6 | 0 | 7 | 0 |
| Comparative Example 1 | 22 | 23 | 21 | 33 | 15 | 1.2 | 29 | 0 |
| Comparative Example 2 | 25 | 25 | 24 | 32 | 15 | 0.8 | 16 | 0 |
| Comparative Example 3 | 23 | 27 | 25 | 33 | 16 | 0.8 | 17 | 0 |
| Comparative Example 4 | 19 | 17 | 18 | 53 | 23 | 0 | 0 | 0 |
| Comparative Example 5 | 18 | 20 | 19 | 57 | 25 | 0 | 0 | 0 |
| Comparative Example 6 | −40 | −51 | −34 | 87 | 13 | 0 | 15 | 0 |
| Comparative Example 7 | −38 | −48 | −30 | 79 | 16 | 0 | 16 | 0 |
| Comparative Example 8 | −12 | −30 | −28 | 66 | 34 | 0 | 15 | 0 |
| Comparative Example 9 | −15 | −31 | −27 | 68 | 32 | 0 | 16 | 0 |
| Comparative Example 10 | −46 | −42 | −43 | 79 | 21 | 0 | 16 | 0 |
| Comparative Example 11 | −49 | −48 | −45 | 89 | 11 | 0 | 18 | 0 |
| Comparative Example 12 | −5 | −16 | −9 | 79 | 21 | 0 | 15 | 0 |
| Comparative Example 13 | 46 | 36 | 35 | 50 | 26 | 0 | 15 | 0 |
| Comparative Example 14 | 60 | 40 | 42 | 54 | 28 | 0 | 16 | 0 |

It is noted from Table 2 that, with the surface treatment compositions of Examples, residues on the SiN substrate can be sufficiently removed as compared with the comparative surface treatment compositions of Comparative Examples.

It is also noted that, with the surface treatment compositions of Examples, an etching rate for the Poly-Si substrate can be suppressed to be low. They are results of evaluation immediately after the production of the surface treatment composition, but the surface treatment composition preferably contains an antifungal agent (antiseptic agent) when the composition is preserved or stored for a long period of time. Since an antifungal agent (antiseptic agent) hardly affects or does not affect the results, the same results as above are considered to be obtained for surface treatment compositions containing an antifungal agent (antiseptic agent).

The results in Table 2 show a difference in pH of the surface treatment compositions before and after the SiN substrate as an object to be polished was subjected to rinse polishing. Differences in pH of each the surface treatment composition before and after rinsing and polishing a poly-Si substrate and a TEOS film as an object to be polished were equivalent to the difference in pH of the corresponding surface treatment composition before and after rinsing and polishing the SiN substrate as an object to be polished.

What is claimed is:

1. A surface treatment composition, comprising:
a component (A); and
a component (B), wherein pH of the composition is 8.0 or more:
the component (A): a polymer having a constituent unit having a quaternary nitrogen-containing onium salt or a constituent unit of a structure (X) below:

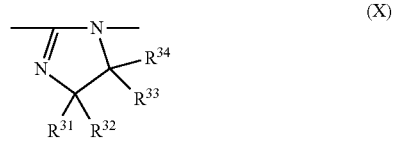

(X)

wherein $R^{31}$ to $R^{34}$ each independently represent a hydrogen atom, or a linear or branched alkyl group having from 1 to 10 carbon atoms,
the component (B): a buffer represented by a formula: $R{-}COO^-NH_4^+$, wherein R is a linear or branched alkyl group having from 1 to 10 carbon atoms, or a phenyl group.

2. The surface treatment composition according to claim 1, wherein the component (A) contains a polymer having a constituent unit having a quaternary nitrogen-containing onium salt.

3. The surface treatment composition according to claim 1, wherein the constituent unit having a quaternary nitrogen-containing onium salt is only a structure (Y) or a structure (Z) below:

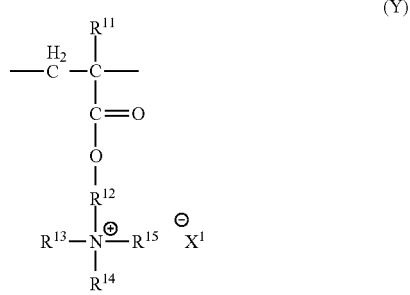

(Y)

wherein $R^{11}$ represents a hydrogen atom or a methyl group, $R^{12}$ represents a linear or branched alkylene group having from 1 to 10 carbon atoms, $R^{13}$ to $R^{15}$ each independently represent a linear or branched alkyl group having from 1 to 10 carbon atoms, and $X^1$ represents an anion moiety,

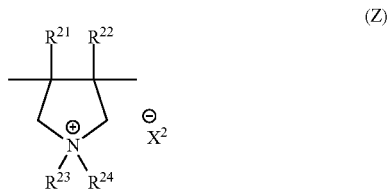

(Z)

wherein $R^{21}$ and $R^{22}$ each independently represent a hydrogen atom, an alkyl group having from 1 to 3 carbon atoms, or a phenyl group, $R^{23}$ and $R^{24}$ each independently represent a linear or branched alkyl group having from 1 to 10 carbon atoms, and $X^2$ represents an anion moiety.

4. The surface treatment composition according to claim 1, wherein the surface treatment composition contains substantially no abrasive grains.

5. The surface treatment composition according to claim 1, wherein the polymer is contained at a proportion of more than 0.05 mass % with respect to the surface treatment composition.

6. The surface treatment composition according to claim 1, wherein the buffer is ammonium acetate.

7. The surface treatment composition according to claim 1, further comprising a component (C):
the component (C): a pH adjusting agent.

8. The surface treatment composition according to claim 7, wherein the pH adjusting agent is ammonia.

9. A surface treatment method comprising subjecting a polished object containing at least one selected from the group consisting of silicon nitride, silicon oxide, and polysilicon to surface treatment using the surface treatment composition according to claim 1, to reduce a residue on a surface of the polished object.

10. The surface treatment method according to claim 9, wherein the surface treatment is carried out by a rinse polishing treatment method or a cleaning treatment method.

11. A method for producing a semiconductor substrate, wherein a polished object is a polished semiconductor substrate,
the method comprising:
polishing a semiconductor substrate before polishing containing at least one selected from the group consisting of silicon nitride, silicon oxide, and polysilicon, using a polishing composition containing an abrasive grain to obtain a polished semiconductor substrate; and
reducing a residue including the abrasive grain on a surface of the polished semiconductor substrate, using the surface treatment composition according to claim 1.

12. The method according to claim 11, wherein a pH of the polishing composition is 8.5 or more.

* * * * *